(12) United States Patent
Shibazaki

(10) Patent No.: US 10,520,828 B2
(45) Date of Patent: *Dec. 31, 2019

(54) LIQUID IMMERSION MEMBER, EXPOSURE APPARATUS, EXPOSURE METHOD, DEVICE FABRICATING METHOD, PROGRAM, AND RECORDING MEDIUM

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/169,210

(22) Filed: Oct. 24, 2018

(65) Prior Publication Data

US 2019/0056672 A1    Feb. 21, 2019

Related U.S. Application Data

(62) Division of application No. 15/786,023, filed on Oct. 17, 2017, now Pat. No. 10,139,736, which is a
(Continued)

(51) Int. Cl.
G03F 7/20    (2006.01)
(52) U.S. Cl.
CPC ............... *G03F 7/70341* (2013.01)
(58) Field of Classification Search
CPC .................................................. G03F 7/70341
(Continued)

(56) References Cited

U.S. PATENT DOCUMENTS 6,208,407 B1    3/2001  Loopstra
6,262,796 B1    7/2001  Loopstra et al.
(Continued)

FOREIGN PATENT DOCUMENTS

CN    101361024 A    2/2009
EP    1 713 113 A1   10/2006
(Continued)

OTHER PUBLICATIONS

Jan. 30, 2019 Office Action issued in European Application No. 13718235.8.
(Continued)

*Primary Examiner* — Hung Nguyen
(74) *Attorney, Agent, or Firm* — Oliff PLC

(57) ABSTRACT

A liquid immersion exposure apparatus includes a liquid immersion member which forms a liquid immersion space under an emitting surface of an optical member. The liquid immersion member includes a first member disposed in a periphery of the optical member, and a second member which is movable relative to the first member and includes a liquid recovery port that recovers at least a portion of liquid in the liquid immersion space. The second member is moved in a direction perpendicular to an optical axis of the optical member so that a relative speed between the second member and an object below the liquid immersion member is smaller than a relative speed between the first member and the object. The second member has an outer surface facing radially outward relative to the optical axis of the optical member, the outer surface does not face toward any surface of the first member.

20 Claims, 19 Drawing Sheets

Related U.S. Application Data division of application No. 15/095,500, filed on Apr. 11, 2016, now Pat. No. 9,810,999, which is a division of application No. 13/793,667, filed on Mar. 11, 2013, now Pat. No. 9,323,160.

(60) Provisional application No. 61/622,235, filed on Apr. 10, 2012.

(58) Field of Classification Search
    USPC .............................................. 355/30, 53, 72
    See application file for complete search history.

(56) References Cited

U.S. PATENT DOCUMENTS

| | | | |
|---|---|---|---|
| 6,341,007 B1 | 1/2002 | Nishi et al. | |
| 6,452,292 B1 | 9/2002 | Binnard | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 7,292,313 B2 | 11/2007 | Poon et al. | |
| 7,804,577 B2 | 9/2010 | Leenders et al. | |
| 7,864,292 B2 | 1/2011 | Leenders et al. | |
| 8,004,651 B2 | 8/2011 | Nagasaka | |
| 8,068,209 B2 | 11/2011 | Poon et al. | |
| 8,134,685 B2 | 3/2012 | Nishii et al. | |
| 8,233,139 B2 | 7/2012 | Nishii | |
| 8,237,911 B2 | 8/2012 | Poon et al. | |
| 8,289,497 B2 | 10/2012 | Poon et al. | |
| 8,400,610 B2 | 3/2013 | Poon et al. | |
| 8,610,873 B2 | 12/2013 | Poon et al. | |
| 8,743,343 B2 | 6/2014 | Poon et al. | |
| 8,891,059 B2 | 11/2014 | Nagasaka | |
| 8,934,080 B2 | 1/2015 | Poon et al. | |
| 9,013,675 B2 | 4/2015 | Nishii et al. | |
| 9,323,160 B2 | 4/2016 | Shibazaki | |
| 9,810,999 B2 * | 11/2017 | Shibazaki | G03F 7/70341 |
| 10,139,736 B2 * | 11/2018 | Shibazaki | G03F 7/70341 |
| 2006/0103821 A1 | 5/2006 | Hendricus Verspay et al. | |
| 2007/0109513 A1 | 5/2007 | Leenders et al. | |
| 2007/0177125 A1 | 8/2007 | Shibazaki | |
| 2007/0288121 A1 | 12/2007 | Shibazaki | |
| 2008/0049209 A1 | 2/2008 | Nagasaka et al. | |
| 2009/0280436 A1 | 11/2009 | Nishii | |
| 2013/0070220 A1 | 3/2013 | Bessems et al. | |
| 2013/0265556 A1 | 10/2013 | Sato | |
| 2014/0022522 A1 | 1/2014 | Sato | |
| 2014/0253886 A1 | 9/2014 | Sato | |
| 2014/0285781 A1 | 9/2014 | Sato | |
| 2014/0300875 A1 | 10/2014 | Sato et al. | |
| 2014/0307235 A1 | 10/2014 | Sato | |

FOREIGN PATENT DOCUMENTS

| | | |
|---|---|---|
| JP | 2009-239286 A | 10/2009 |
| KR | 20080068138 A | 7/2008 |
| TW | 200947145 A | 11/2009 |
| WO | 01/35168 A1 | 5/2001 |
| WO | 2004/019128 A2 | 3/2004 |
| WO | 2007/057673 A1 | 5/2007 |
| WO | 2009/119898 A1 | 10/2009 |

OTHER PUBLICATIONS

Sep. 25, 2015 Office Action issued in Chinese Application No. 201380029835.3.
May 1, 2015 Office Action issued in U.S. Appl. No. 13/793,667.
Aug. 31, 2015 Notice of Allowance issued in U.S. Appl. No. 13/793,667.
Dec. 21, 2015 Notice of Allowance issued in U.S. Appl. No. 13/793,667.
Jul. 5, 2013 Search Report issued in International Application No. PCT/JP2013/058454.
Jul. 5, 2013 Written Opinion issued in International Application No. PCT/JP2013/058454.
Oct. 18, 2016 Office Action issued in Japanese Application No. 2014-550210.
Feb. 9, 2017 Office Action issued in Taiwanese Application No. 102109578.
May 9, 2017 Office Action issued in Japanese Application No. 2014-550210.
Nov. 7, 2016 Office Action issued in U.S. Appl. No. 15/095,500.
Mar. 22, 2017 Notice of Allowance issued in U.S. Appl. No. 15/095,500.
Jul. 3, 2017 Notice of Allowance issued in U.S. Appl. No. 15/095,500.
Feb. 22, 2018 Notice of Allowance issued in U.S. Appl. No. 15/786,023.
Jul. 13, 2018 Notice of Allowance issued in U.S. Appl. No. 15/786,023.
Sep. 17, 2019 Office Action issued in Korean Patent Application No. 10-2014-7031457.

* cited by examiner

US 10,520,828 B2

LIQUID IMMERSION MEMBER, EXPOSURE APPARATUS, EXPOSURE METHOD, DEVICE FABRICATING METHOD, PROGRAM, AND RECORDING MEDIUM

CROSS-REFERENCE TO RELATED APPLICATIONS

This is a Divisional of U.S. application Ser. No. 15/786,023 filed Oct. 17, 2017 (now U.S. Pat. No. 10,139,736), which in turn is a Divisional of U.S. application Ser. No. 15/095,500 filed Apr. 11, 2016 (now U.S. Pat. No. 9,810,999), which is a Divisional of U.S. application Ser. No. 13/793,667 filed Mar. 11, 2013 (now U.S. Pat. No. 9,323,160), which is a non-provisional of U.S. Provisional Application No. 61/622,235, filed on Apr. 10, 2012. The entire contents of the prior applications are incorporated herein by reference in their entireties.

BACKGROUND

Field of the Invention

The present invention relates to a liquid immersion member, an exposure apparatus, an exposure method, a device fabricating method, program, and a recording medium.

Description of Related Art

In exposure apparatuses used for a photolithography process, a liquid immersion exposure apparatus that exposes a substrate with exposure light through liquid is known, for example, as disclosed in the following U.S. Pat. No. 7,864,292.

SUMMARY

In a liquid immersion exposure apparatus, for example, when liquid flows out from a predetermined space or remains on an object such as a substrate, there is a possibility of a defective exposure being generated. As a result, there is a possibility of a defective device being generated.

An object of the present invention is to provide a liquid immersion member, an exposure apparatus, and an exposure method, which are capable of suppressing the generation of a defective exposure. In addition, another object of the present invention is to provide a device fabricating method, a program, and a recording medium which are capable of suppressing generation of a defective device.

According to a first aspect of the present invention, there is provided a liquid immersion member in which a liquid immersion space is formed on an object movable below an optical member so that a light path of exposure light emitted from an emission surface of the optical member is filled with liquid, which includes: a first member which is disposed in at least a portion of the periphery of the optical member; and a second member which is movable below the first member to interpose a gap therebetween and which includes a recovery port that recovers at least a portion of the liquid in the liquid immersion space.

According to a second aspect of the present invention, there is provided a liquid immersion member in which a liquid immersion space is formed on an object movable below an optical member so that a light path of exposure light emitted from an emission surface of the optical member is filled with liquid, comprising: a first member which is disposed in at least a portion of the periphery of the optical member; and a second member, movable at the outside of at least a portion of the first member with respect to the light path of the exposure light, which includes a recovery port that recovers at least a portion of the liquid of the liquid immersion space.

According to a third aspect of the present invention, there is provided an exposure apparatus that exposes a substrate with exposure light through liquid, including: the liquid immersion member according to the first aspect.

According to a fourth aspect of the present invention, there is provided a device fabricating method which includes the steps of: exposing a substrate using the exposure apparatus according to any one of the first to third aspects; and developing the exposed substrate.

According to a fifth aspect of the present invention, there is provided an exposure method for exposing a substrate with exposure light through liquid, which includes the steps of: forming a liquid immersion space so that a light path of the exposure light emitted from an emission surface of an optical member is filled with the liquid; exposing the substrate with the exposure light emitted from the emission surface through the liquid in the liquid immersion space; and moving a second member which is disposed below a first member to maintain a gap with respect to the first member disposed in at least a portion of the periphery of the optical member and which includes a recovery port that recovers at least a portion of the liquid in the liquid immersion space.

According to a sixth aspect of the present invention, there is provided a device fabricating method which includes the steps of: exposing a substrate using the exposure method according to the fifth aspect; and developing the exposed substrate.

According to a seventh aspect of the present invention, there is provided a program causing a computer to execute control of an exposure apparatus that exposes a substrate with exposure light through liquid, the program including the steps of: forming a liquid immersion space so that a light path of the exposure light emitted from an emission surface of an optical member is filled with the liquid; exposing the substrate with the exposure light emitted from the emission surface through the liquid in the liquid immersion space; and moving a second member which is disposed below a first member to maintain a gap with respect to the first member disposed in at least a portion of the periphery of the optical member and which includes a recovery port that recovers at least a portion of the liquid in the liquid immersion space.

According to a eighth aspect of the present invention, there is provided a computer readable recording medium having the program according to the seventh aspect recorded thereon.

According to the aspects of the present invention, it is possible to suppress the generation of a defective exposure. In addition, according to the aspects of the present invention, it is possible to suppress generation of a defective device.

DESCRIPTION OF EMBODIMENTS

Hereinafter, embodiments of the present invention will be described with reference to the drawings, but the present invention is not limited thereto. In the following description, an XYZ orthogonal coordinate system is set, and a positional relationship of each part will be described with reference to the XYZ orthogonal coordinate system. A predetermined direction within the horizontal plane is set to an X-axis direction, a direction orthogonal to the X-axis direction within the horizontal plane is set to a Y-axis direction, and a direction (that is, vertical direction) orthogonal to the X-axis direction and the Y-axis direction, respectively, is set to a Z-axis direction. In addition, rotational (tilting) directions around the X-axis, the Y-axis, and the Z-axis are set to a θX direction, a θY direction, and a θZ direction, respectively.

First Embodiment

Figure 1:
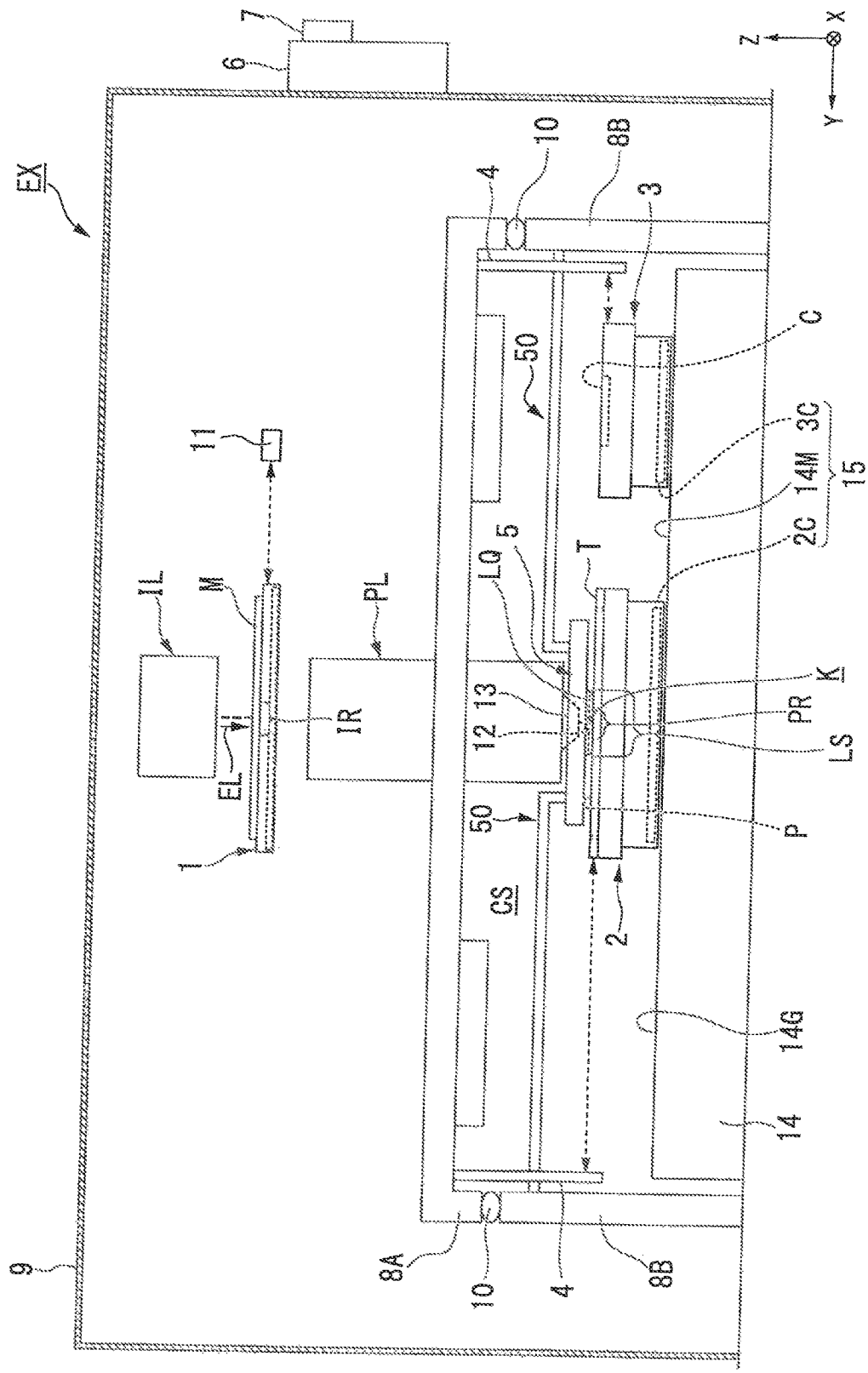
FIG. 1 is a diagram illustrating an example of an exposure apparatus according to a first embodiment.

A first embodiment will be described below. FIG. 1 is a schematic configuration diagram illustrating an example of an exposure apparatus EX according to the first embodiment. The exposure apparatus EX of the present embodiment is a liquid immersion exposure apparatus that exposes a substrate P with exposure light EL through exposure liquid LQ. In the present embodiment, a liquid immersion space LS is formed so that a light path K of exposure light EL with which the substrate P is irradiated is filled with the liquid LQ. The liquid immersion space LS is a portion (a space or a region) which is filled with liquid. The substrate P is exposed with the exposure light EL through the exposure liquid LQ of the liquid immersion space LS. In the present embodiment, water (pure water) is used as the exposure liquid LQ.

In addition, the exposure apparatus EX of the present embodiment is, for example, an exposure apparatus including a substrate stage and a measurement stage as disclosed in U.S. Pat. No. 6,897,963, EP Patent Application Publication No. 1,713,113 and the like.

In FIG. 1, the exposure apparatus EX includes a movable mask stage 1 that holds a mask M, a movable substrate stage 2 that holds the substrate P, a movable measurement stage 3 on which a measurement member (measurement instrument) C measuring the exposure light EL is mounted without holding the substrate P, a measurement system 4 that measures positions of the substrate stage 2 and the measurement stage 3, an illumination system IL that illuminates the mask M with the exposure light EL, a projection optical system PL that projects an image of a pattern of the mask M, illuminated with the exposure light EL, onto the substrate P, a liquid immersion member 5 that forms the liquid immersion space LS, a control device 6 that controls an operation of the entire exposure apparatus EX, and a storage device 7, connected to the control device 6, which stores various types of information about an exposure.

In addition, the exposure apparatus EX includes a basic frame 8A that supports various types of measurement systems including the projection optical system PL and the measurement system 4, a device frame 8B that supports the basic frame 8A, a vibration-proofing device 10, disposed between the basic frame 8A and the device frame 8B, which suppresses the transmission of a vibration to the basic frame 8A from the device frame 8B, and a chamber device 9 that adjusts the environment (at least one of temperature, humidity, pressure, and cleanliness level) of a space CS to which the exposure light EL travels. At least the projection optical system PL, the liquid immersion member 5, the substrate stage 2, and the measurement stage 3 are disposed at the space CS. In the present embodiment, the mask stage 1 and at least a portion of the illumination system IL are also disposed at the space CS. The vibration-proofing device 10 includes a spring gear and the like. In the present embodiment, the vibration-proofing device 10 includes a pneumatic spring (for example, air mount). Meanwhile, a detection system that detects an alignment mark on the substrate P or a detection system that detects a position of the object surface such as the substrate P may be supported by the basic frame 8A.

The mask M includes a reticle on which a device pattern projected onto the substrate P is formed. The mask M includes a transmissive mask having, for example, a transparent plate such as a glass plate, and a pattern formed on the transparent plate using a light-shielding material such as chromium. Meanwhile, a reflective mask can be used as the mask M.

The substrate P is a substrate for manufacturing a device. The substrate P includes, for example, a base material such as a semiconductor wafer, and a photosensitive film formed on the base material. The photosensitive film is a film of a photosensitive material (photoresist). In addition, the substrate P may include another film in addition to the photosensitive film. For example, the substrate P may include an antireflection film, and may include a protective film (topcoat film) that protects the photosensitive film.

The illumination system IL irradiates a predetermined illumination region IR with the exposure light EL. The illumination region IR includes a position which can be irradiated with the exposure light EL emitted from the illumination system IL. The illumination system IL illuminates at least a portion of the mask M disposed at the illumination region IR with the exposure light EL having a uniform illuminance distribution. As the exposure light EL emitted from the illumination system IL, for example, far-ultraviolet light (DUV light) such as emission lines (g line, h line, and i line) emitted from a mercury lamp and KrF excimer laser light (wavelength 248 nm), ArF excimer laser light (wavelength 193 nm), vacuum-ultraviolet light (VUV light) such as $F_2$ laser light (wavelength 157 nm), and the like are used. In the present embodiment, as the exposure light EL, ArF excimer laser light which is ultraviolet light (vacuum-ultraviolet light) is used.

The mask stage 1 can move in a state where the mask M is held. The mask stage 1 moves by the operation of a drive system 11 including a planar motor, for example, as disclosed in U.S. Pat. No. 6,452,292. In the present embodiment, the mask stage 1 can move in six directions of the X-axis, Y-axis, Z-axis, θX, θY, and θZ by the operation of the drive system 11. Meanwhile, the drive system 11 may not include a planar motor. For example, the drive system 11 may include a linear motor.

The projection optical system PL irradiates a predetermined projection region PR with the exposure light EL. The projection region PR includes a position which can be irradiated with the exposure light EL emitted from the projection optical system PL. The projection optical system PL projects an image of a pattern of the mask M, at a predetermined projection magnification, onto at least a portion of the substrate P disposed at the projection region PR. The projection optical system PL of the present embodiment is a reduction system of which the projection magnification is, for example, ¼, ⅕, ⅛ or the like. Meanwhile, the projection optical system PL may be any of an equalization system and a magnification system. In the present embodiment, the optical axis of the projection optical system PL is parallel to the Z-axis. In addition, the projection optical system PL may be any of a refraction system which does not include a reflective optical element, a reflection system which does not include a refractive optical element, and a reflection and refraction system which includes a reflective optical element and a refractive optical element. In addition, the projection optical system PL may form any of an inverted image and an erected image.

The projection optical system PL includes a terminal optical element 13 having an emission surface 12 from which the exposure light EL is emitted. The emission surface 12 emits the exposure light EL toward the image plane of the projection optical system PL. The terminal optical element 13 is an optical element which is closest to the image plane of the projection optical system PL among a plurality of optical elements of the projection optical system PL. The projection region PR includes a position which can be irradiated with the exposure light EL emitted from the emission surface 12. In the present embodiment, the emission surface 12 is directed toward the −Z-axis direction, and is parallel to the XY plane. Meanwhile, the emission surface 12 directed toward the −Z-axis direction may be a convex surface, and may be a concave surface. Meanwhile, the emission surface 12 may be inclined with respect to the XY plane, and may include a curved surface. In the present embodiment, the optical axis of the terminal optical element 13 is parallel to the Z-axis. In the present embodiment, the exposure light EL emitted from the emission surface 12 travels in the −Z-axis direction.

The substrate stage 2 can move within the XY plane including a position (projection region PR) which can be irradiated with the exposure light EL from the emission surface 12 in a state where the substrate P is held. The measurement stage 3 can move within the XY plane including a position (projection region PR) which can be irradiated with the exposure light EL from the emission surface 12 in a state where the measurement member (measurement instrument) C is mounted. The substrate stage 2 and the measurement stage 3 can move on a guide surface 14G of a base member 14. In the present embodiment, the guide surface 14G and the XY plane are substantially parallel to each other.

In the present embodiment, the substrate stage 2 includes a first holding portion that releasably holds the substrate P and a second holding portion, disposed at the periphery of the first holding portion, which releasably holds a cover member T as disclosed, for example, in U.S. Patent Application Publication No. 2007/0177125, U.S. Patent Application Publication No. 2008/0049209, and the like. The first holding portion holds the substrate P so that the surface (upper surface) of the substrate P and the XY plane are substantially parallel to each other. In the present embodiment, the upper surface of the substrate P held by the first holding portion and the upper surface of the cover member T held by the second holding portion are disposed at substantially the same plane. Meanwhile, the upper surface of the substrate P held by the first holding portion and the upper surface of the cover member T held by the second holding portion may be disposed within the same plane, the upper surface of the cover member T may be inclined with respect to the upper surface of the substrate P, and the upper surface of the cover member T may include a curved surface.

The substrate stage 2 and the measurement stage 3 move by the operation of a drive system 15 including a planar motor as, for example, disclosed in U.S. Pat. No. 6,452,292. The drive system 15 includes a slider 2C disposed at the substrate stage 2, a slider 3C disposed at the measurement stage 3, and a stator 14M disposed at the base member 14. The substrate stage 2 and the measurement stage 3 can move in six directions of the X-axis, Y-axis, Z-axis, θX, θY, and θZ on the guide surface 14G by the operation of the drive system 15. Meanwhile, the drive system 15 may not include a planar motor. For example, the drive system 15 may include a linear motor.

The measurement system 4 includes an interferometer system. The interferometer system includes a unit that irradiates a measurement mirror of the substrate stage 2 and a measurement mirror of the measurement stage 3 with measurement light and measures the positions of the substrate stage 2 and the measurement stage 3. Meanwhile, the measurement system may include an encoder system, for example, as disclosed in Specification of U.S. Patent Application Publication No. 2007/0288121. Meanwhile, the measurement system 4 may include only any one of the interferometer system and the encoder system.

When an exposure process of the substrate P is performed, or when a predetermined measurement process is performed, the control device 6 controls the positions of the substrate stage 2 (substrate P) and the measurement stage 3

(measurement member C) on the basis of the measurement result of the measurement system 4.

Figure 2:
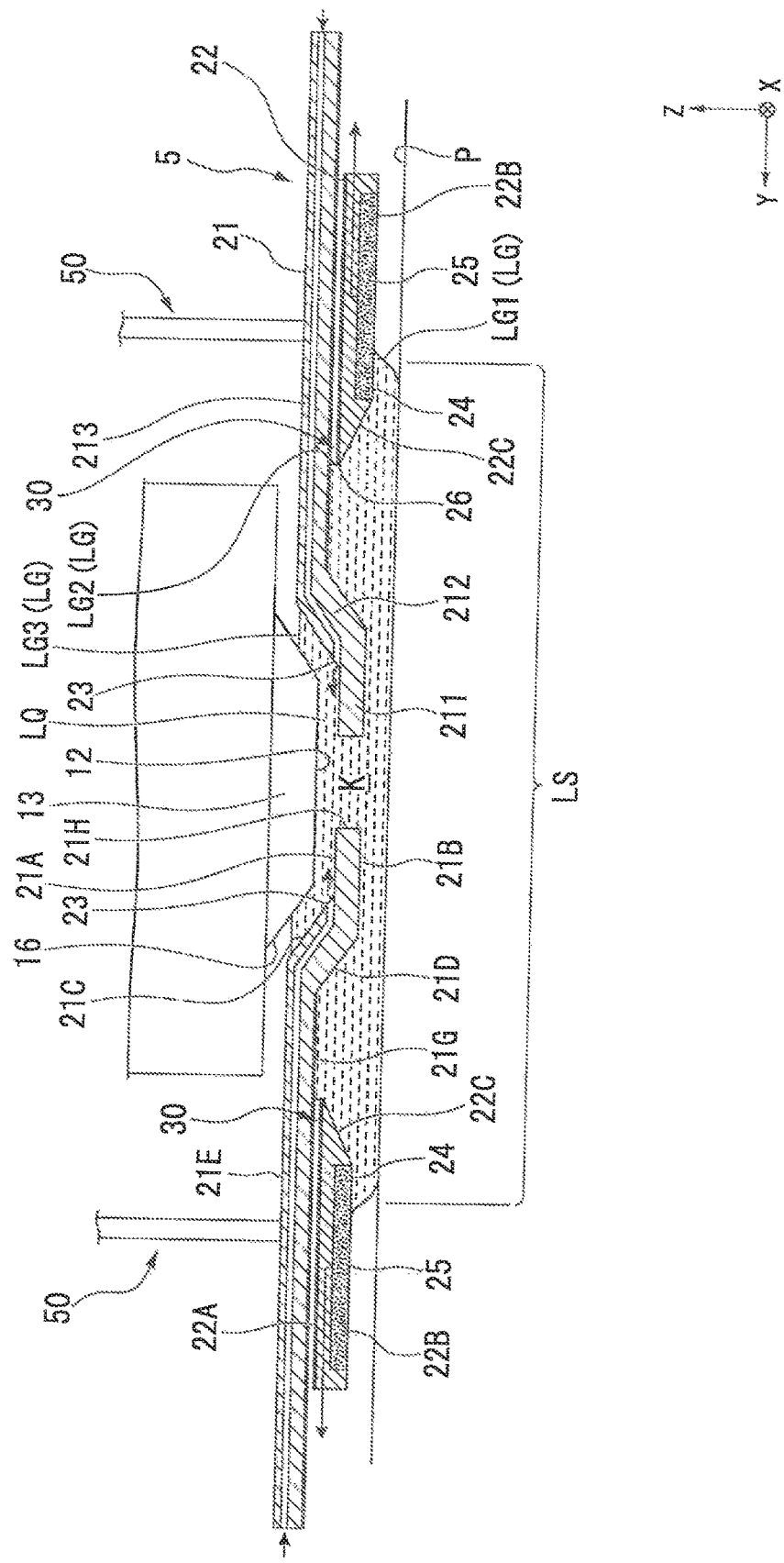
FIG. 2 is a side cross-sectional view illustrating an example of a liquid immersion member according to the first embodiment.
Figure 3:
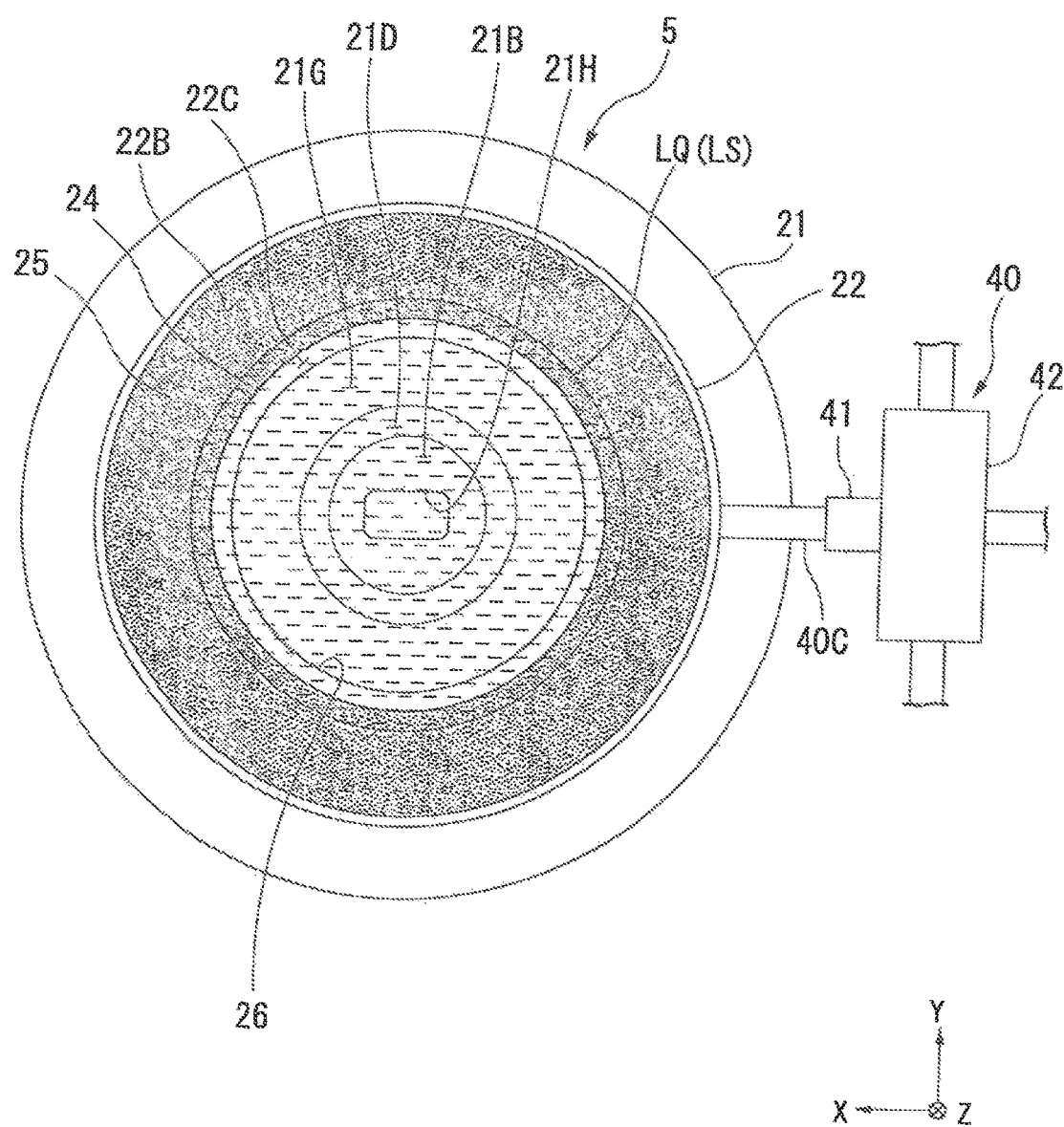
FIG. 3 is a diagram when the liquid immersion member according to the first embodiment is viewed from the lower side.
Figure 4:
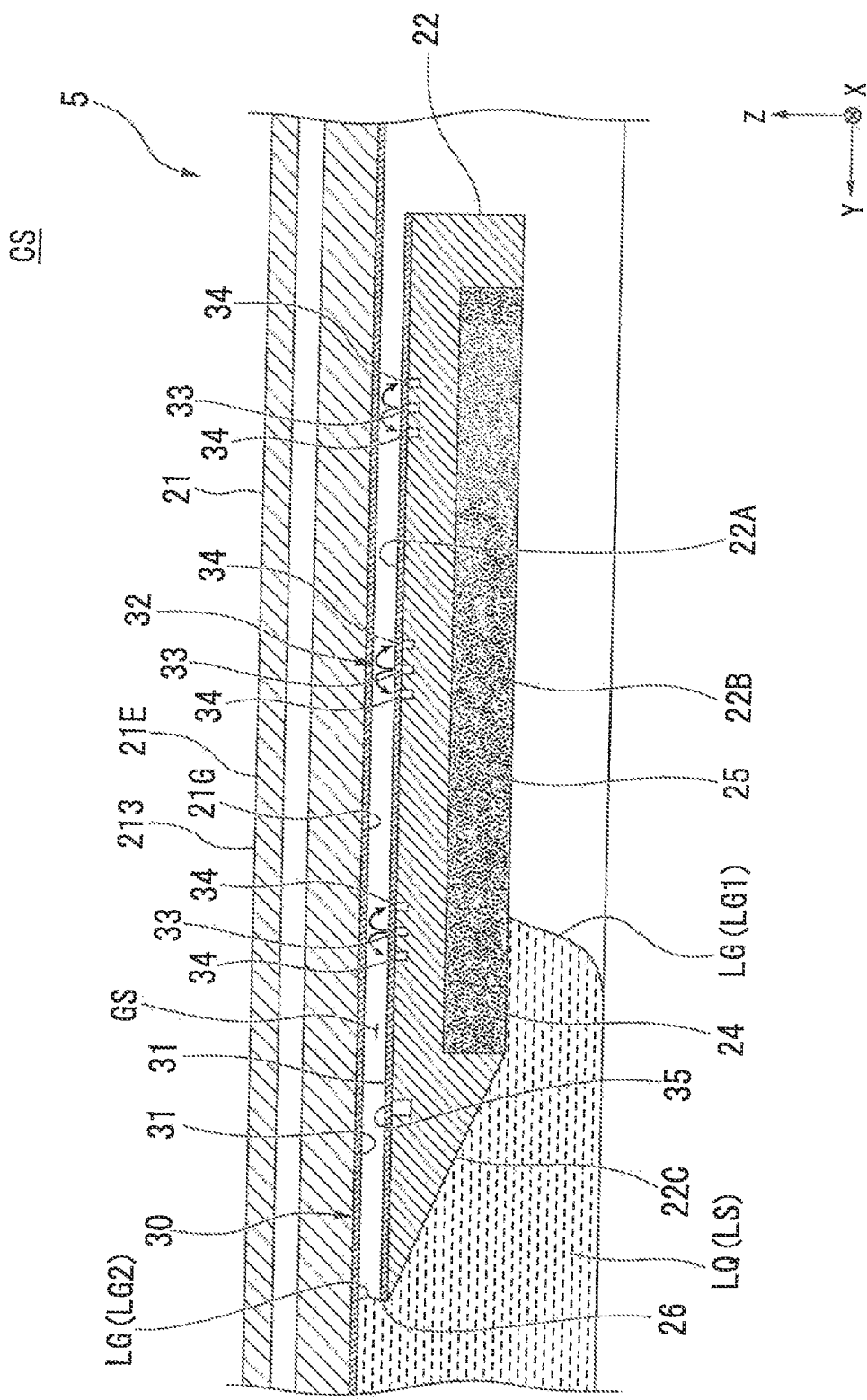
FIG. 4 is a side cross-sectional view illustrating a portion of the liquid immersion member according to the first embodiment.

Next, the liquid immersion member 5 according to the present embodiment will be described. FIG. 2 is a side cross-sectional view illustrating an example of the liquid immersion member 5 according to the present embodiment. FIG. 3 is a diagram when the liquid immersion member 5 is viewed from the lower side (−Z-axis side). FIG. 4 is an enlarged view illustrating a portion of FIG. 2. Meanwhile, in the present embodiment, the liquid immersion member 5 is supported by the device frame 8B through a supporter 50.

The liquid immersion member 5 forms the liquid immersion space LS so that the light path K of the exposure light EL emitted from the emission surface 12 of the terminal optical element 13 is filled with the liquid LQ. A portion of the liquid immersion space LS is formed between the liquid immersion member 5 and an object capable of moving within the XY plane including a position facing the emission surface 12.

The object capable of moving within the XY plane including a position facing the emission surface 12 includes an object capable of facing the emission surface 12, and includes an object capable of being disposed at the projection region PR. In addition, the object includes an object movable below the terminal optical element 13. In the present embodiment, the object includes at least one of at least a portion (for example, cover member T of the substrate stage 2) of the substrate stage 2, the substrate P held by the substrate stage 2 (first holding portion), and the measurement stage 3. In the exposure of the substrate P, the liquid immersion space LS is formed so that the light path K of the exposure light EL with which the substrate P is irradiated is filled with the liquid LQ. When the substrate P is irradiated with the exposure light EL, the liquid immersion space LS is formed so that only a region of a portion of the surface of the substrate P including the projection region PR is covered with the liquid LQ.

In the following description, the object facing the emission surface 12 is the substrate P. Meanwhile, as mentioned above, the object capable of facing the emission surface 12 may be at least one of the substrate stage 2 and the measurement stage 3, and may be a separate object from the substrate P, the substrate stage 2, and the measurement stage 3. In addition, the liquid immersion space LS may be formed so as to straddle the cover member T of the substrate stage 2 and the substrate P, and the liquid immersion space LS may be formed so as to straddle the substrate stage 2 and the measurement stage 3.

In the present embodiment, the liquid immersion member 5 includes a first member 21 disposed in at least a portion of the periphery of the terminal optical element 13 (light path of the exposure light EL), and a second member 22 having a recovery port 24 that recovers the liquid LQ. At least a portion of the second member 22 is disposed below the first member 21. At least a portion of the first member 21 is disposed at a position which is further apart from the substrate P (object) than the second member 22. The second member 22 is disposed between at least a portion of the first member 21 and the substrate P (object). In addition, at least a portion of the second member 22 is disposed at the outside of the first member 21 with respect to the light path (optical axis of the terminal optical element 13) of the exposure light EL. In the present embodiment, the light path of the exposure light EL includes a light path of the exposure light EL (light path of the exposure light EL proceeding through the terminal optical element 13) in the terminal optical element 13. In addition, the light path of the exposure light EL includes the light path K of the exposure light EL emitted from the emission surface 12. In the present embodiment, the first member 21 is disposed in at least a portion of the periphery of the terminal optical element 13 (light path of the exposure light EL in the terminal optical element 13). Meanwhile, the first member 21 may be not disposed in the periphery of the terminal optical element 13, but may be disposed in at least a portion of the periphery of the light path K of the exposure light EL emitted from the emission surface 12. The first member 21 may be disposed in at least a portion of the periphery of the terminal optical element 13, and in at least a portion of the periphery of the light path K of the exposure light EL emitted from the emission surface 12.

In addition, in the present embodiment, the liquid immersion member 5 includes a supply port 23 that supplies the liquid LQ for forming the liquid immersion space LS. The supply port 23 is disposed at the inside of the recovery port 24 with respect to the radiation direction for the optical axis (light path K) of the terminal optical element 13. In the present embodiment, the supply port 23 is disposed at the first member 21. The supply port 23 is disposed further upward than the recovery port 24. Meanwhile, the supply port 23 may be disposed at the second member 22, and may be disposed at both the first member 21 and the second member 22.

In the present embodiment, the first member 21 is disposed in at least a portion of the periphery of the terminal optical element 13 with a gap interposed therebetween. In the present embodiment, the first member 21 is annular. In the present embodiment, a portion of the first member 21 is disposed at the periphery of the terminal optical element 13, and a loop-shaped gap is formed between the terminal optical element 13 and the first member 21. The shape of the gap may be circular, or may be non-circular.

In addition, in the present embodiment, a portion of the first member 21 is disposed below the emission surface 12. That is, a portion of the first member 21 is disposed at the periphery of the light path K between the emission surface 12 and the upper surface of the substrate P (object).

The first member 21 includes a first portion 211 of which at least a portion faces the emission surface 12 of the terminal optical element 13, a second portion 212 of which at least a portion is disposed at the periphery of an external surface 16 of the terminal optical element 13, and a third portion 213 disposed at the periphery of the second portion 212. The external surface 16 of the terminal optical element 13 does not emit the exposure light EL. In other words, the exposure light EL does not pass through the external surface 16. In the present embodiment, in at least a portion of the periphery of the optical axis (light path K) of the terminal optical element 13, the external surface 16 is inclined upward toward the outside with respect to the radiation direction for the optical axis (light path K) of the terminal optical element 13.

The third portion 213 is disposed further upward than the first portion 211. In addition, the third portion 213 is disposed at the outside of the first portion 211 with respect to the radiation direction for the optical axis (light path K) of the terminal optical element 13.

Meanwhile, the first member 21 may not include the first portion 211. For example, the first member 21 may be disposed further upward than the emission surface 12. In addition, the first member 21 may not include the second portion 212. For example, the first member 21 (first portion 211 and third portion 213) may be disposed below the emission surface 12.

In the present embodiment, the first member 21 is supported by the device frame 8B through the supporter 50. In the present embodiment, the supporter 50 and the third portion 213 are connected to each other. Meanwhile, when the first member 21 does not include the third portion 213, the supporter 50 may be connected to at least a portion of the first member 21. The position of the device frame 8B is substantially fixed. The supporter 50 supports the first member 21 above the substrate P (object). The supporter 50 supports the first member 21 so that a gap is formed between the terminal optical element 13 and the first member 21. The position of the projection optical system PL (terminal optical element 13) is substantially fixed. The position of the first member 21 is also substantially fixed. That is, in the present embodiment, the terminal optical element 13 and the first member 21 do not substantially move. The relative positions of the terminal optical element 13 and the first member 21 do not change.

The first member 21 includes an opening 21H allowing the exposure light EL emitted from the emission surface 12 to pass therethrough. The first portion 211 includes the opening 21H. In addition, the first member 21 includes an upper surface 21A of which at least a portion faces the emission surface 12, and a lower surface 21B facing in the opposite direction to that of the upper surface 21A. The first portion 211 includes the upper surface 21A and the lower surface 21B. The upper surface 21A and the emission surface 12 face each other with a gap therebetween. The substrate P (object) can face the lower surface 21B with a gap therebetween. The upper surface 21A is disposed at the periphery of the upper end of the opening 21H. The lower surface 21B is disposed at the periphery of the lower end of the opening 21H. In the present embodiment, the upper surface 21A is substantially parallel to the XY plane. The lower surface 21B is substantially parallel to the XY plane. The lower surface 21B can hold the liquid LQ between the substrate P (object) and the lower surface.

In addition, the first member 21 includes an internal surface 21C, disposed at the periphery of the upper surface 21A, which faces the external surface 16 of the terminal optical element 13, and an external surface 21D facing in the opposite direction to that of the internal surface 21C. The external surface 21D is disposed at the periphery of the lower surface 21B. The second portion 212 includes the internal surface 21C and the external surface 21D. The external surface 16 and the internal surface 21C face each other with a gap therebetween. The internal surface 21C and the external surface 21D are inclined upward toward the outside with respect to the radiation direction for the optical axis (light path K) of the terminal optical element 13. Meanwhile, at least one of the internal surface 21C and the external surface 21D may be parallel to the optical axis of the terminal optical element 13 (parallel to the Z-axis).

In addition, the first member 21 includes an upper surface 21E disposed at the periphery of the internal surface 21C, and a lower surface 21G facing in the opposite direction to that of the upper surface 21E. The third portion 213 includes the upper surface 21E and the lower surface 21G. The lower surface 21G is disposed at the periphery of the external surface 21D. The external surface 21D is disposed so as to link the outer edge of the lower surface 21B to the inner edge of the lower surface 21G. In the present embodiment, the upper surface 21E and the lower surface 21G are substantially parallel to the XY plane, but may not be parallel thereto.

The second member 22 can move with respect to the first member 21. In addition, the second member 22 can move with respect to the terminal optical element 13. That is, in the present embodiment, the relative positions of the second member 22 and the first member 21 change. The relative positions of the second member 22 and the terminal optical element 13 change.

In the present embodiment, the second member 22 can move substantially parallel to the XY plane. Meanwhile, the second member 22 may be able to move in only one axial direction (for example, X-axis direction or Y-axis direction). In addition, the second member 22 may be able to move in at least one direction of the Z-axis, θX, θY, and θZ, in addition to the movement in the direction substantially parallel to the XY plane.

The second member 22 can move below at least a portion of the first member 21. In the present embodiment, the second member 22 can move below the third portion 213. In addition, the second member 22 can move at the outside of at least a portion of the first member 21 with respect to the light path of the exposure light EL (optical axis of the terminal optical element 13). In the present embodiment, the second member 22 can move at the outsides of the first portion 211 and the second portion 212 with respect to the light path of the exposure light EL (optical axis of the terminal optical element 13). When the second member 22 includes the first portion 211, and does not include the second portion 212, the second member 22 can move at the outside of the first portion 211 with respect to the light path of the exposure light EL (optical axis of the terminal optical element 13). When the second member 22 includes the second portion 212, and does not include the first portion 211, the second member 22 can move at the outside of the second portion 212 with respect to the light path of the exposure light EL (optical axis of the terminal optical element 13). In the present embodiment, the second member 22 is supported by the device frame 8B through the supporter 50.

At least a portion of the second member 22 is movably disposed between the first member 21 and the substrate P (object) with respect to the direction parallel to the optical axis of the terminal optical element 13. The second member 22 can move between the first member 21 and the substrate P (object). In addition, in the present embodiment, the second member 22 can move concurrently with at least a portion of the movement of the substrate P (object). In addition, in the present embodiment, the second member 22 can move in a state where the liquid immersion space LS is formed. In addition, the second member 22 can move in a state where the liquid LQ is present in at least a portion of a space between the second member 22 and the substrate P (object). Meanwhile, the second member 22 can move in coordination with the movement of the substrate P (object), and can move independently of the substrate P (object).

Meanwhile, the second member 22 may move when the second member 22 and the substrate P (object) do not face each other. In other words, the second member 22 may move when an object is not present below the second member 22. Meanwhile, the second member 22 may move when the liquid LQ is not present in a space between the second member 22 and the substrate P (object). For example, the second member 22 may move when the liquid immersion space LS is not formed.

In the present embodiment, the second member 22 is disposed in at least a portion of the periphery of the terminal optical element 13. In the present embodiment, the second member 22 is disposed to maintain a gap with respect to the first member 21. The second member 22 is disposed in at least a portion of the periphery of the first member 21 with a gap therebetween. The second member 22 is disposed at the outside of the first member 21 with respect to the light path of the exposure light EL (optical axis of the terminal optical element 13), with a gap interposed therebetween. In addition, the second member 22 is disposed below at least a portion of the first member 21 with a gap therebetween.

In the present embodiment, the second member 22 is annular. In the present embodiment, the second member 22 includes an opening 26. The opening 26 of the second member allows the exposure light EL to pass therethrough. In addition, in the present embodiment, the opening 26 of the second member 22 allows at least a portion of the first member 21 to be disposed therein. In the present embodiment, the second member 22 is disposed at the periphery of the second portion 212 below the third portion 213. The second member 22 is disposed so that a gap is formed between the second portion 212 and the third portion 213.

For example, as shown in FIG. 3, in the present embodiment, the second member 22 is annular. In the present embodiment, the opening 26 is substantially circular.

In the present embodiment, the second member 22 includes an upper surface 22A facing the lower surface 21G of the first member 21, and a lower surface 22B facing in the opposite direction to that of the upper surface 22A. The upper surface 22A is disposed at the periphery of the opening 26. The lower surface 22B can face the substrate P (object). The lower surface 21G of the first member 21 and the upper surface 22A of the second member 22 face each other with a gap therebetween. The substrate P (object) can face the lower surface 22B with a gap therebetween. In the present embodiment, the second member 22 can move below the lower surface 21G of the first member 21 to interpose a gap therebetween.

In the present embodiment, the movement of the second member 22 is guided by the lower surface 21G. In a state where the lower surface 21G and the upper surface 21A face each other with a gap therebetween, the second member 22 moves along the lower surface 21G. In the following description, the lower surface 21G of the first member 21 is appropriately referred to as a guide surface 21G, and the upper surface 22A of the second member 22 is appropriately referred to as a movement surface 22A. Meanwhile, the lower surface 21G of the first member 21 may not have a function as a guide surface. The second member 22 may not include the third portion 213.

In the present embodiment, the second member 22 is disposed at the periphery of the external surface 21D of the first member 21. The second member 22 moves in a space around the external surface 21D. The second member 22 moves in a space around the external surface 21D so as not to come into contact with the first member 21. The second member 22 can move in the periphery of the first member 21 (second member 212) with a gap from the first member 21.

In the present embodiment, the guide surface 21G is disposed further upward than the lower surface 21B, in the periphery of the lower surface 21B and the external surface 21D. The lower surface 22B of the second member 22 is disposed further upward than the lower surface 21B of the first member 21. Meanwhile, the lower surface 22B of the second member 22 may be disposed further downward than the lower surface 21B of the first member 21. In addition, as mentioned above, when the first member 21 is not provided with the second portion 212, the guide surface 21G may be disposed at the same plane as the lower surface 21B of the first member 21, or further downward than the lower surface 21B of the first member 21.

As shown in FIG. 3, the exposure apparatus EX includes a drive system 40 that moves the second member 22. In the present embodiment, the drive system 40 can move the second member 22 within the XY plane. In the example shown in FIG. 3, the drive system 40 includes a connecting member 40C connected to the second member 22, a first actuator 41 capable of moving the connecting member 40C in the Y-axis direction, and a second actuator 42 capable of moving the first actuator 41 in the X-axis direction. At least one of the first actuator 41 and the second actuator 42 includes a motor or the like which is driven by, for example, a Lorentz force. Meanwhile, the drive system 40 is not limited to the configuration shown in FIG. 3. Meanwhile, the drive system 40 may be configured to move the second member 22 in only one axial direction (for example, X-axis direction or Y-axis direction), and may be configured to move the second member 22 in at least one direction of the Z-axis, θX, θY, and θZ in addition to the movement in the direction substantially parallel to the XY plane.

The drive system 40 moves the second member 22 so that at least a portion of the guide surface 21G and at least a portion of the movement surface 22A continue to face each other. In other words, the drive system 40 moves the second member 22 so that at least a portion of the movement surface 22A does not protrude to the outside of the guide surface 21G. In addition, the drive system 40 moves the second member 22 so that the first member 21 and the second member 22 do not come into contact with each other.

In the present embodiment, the liquid LQ is not present between the guide surface 21G and the movement surface 22A. The infiltration of the liquid LQ between the guide surface 21G and the movement surface 22A is suppressed. The liquid immersion member 5 includes a suppression portion 30 that suppresses the infiltration of the liquid LQ into a gap between the guide surface 21G and the movement surface 22A. The suppression portion 30 suppresses the infiltration of the liquid LQ into a space GS between the guide surface 21G and the movement surface 22A from a gap between the inner edge of the movement surface 22A of the second member 22 defining the opening 26 and the guide surface 21G of the first member 21. The suppression portion 30 includes a liquid-repellent film 31 disposed on the guide surface 21G. In addition, the suppression portion 30 includes the liquid-repellent film 31 disposed on the movement surface 22A. Meanwhile, the film 31 may be disposed on both the guide surface 21G and the movement surface 22A, and may be disposed on only one of them. The liquid LQ of the liquid immersion space LS is prevented from infiltrating into the gap between the guide surface 21G and the movement surface 22A by the film 31.

The contact angle of the film 31 with the liquid LQ is, for example, 90 degrees or more. Meanwhile, the contact angle of the film 31 may be 100 degrees or more, and may be 110 degrees or more. The film 31 may be formed of, for example, a material containing fluorine, and may be formed of a material containing silicon. The film 31 may contain, for example, PFA (Tetra fluoro ethylene-perfluoro alkylvinyl ether copolymer), may contain PTFE (Poly tetra fluoro ethylene), may contain PEEK (polyetheretherketone), and may contain Teflon (registered trademark).

In addition, the suppression portion 30 includes a gas supply portion 32 that supplies gas between the guide surface 21G and the movement surface 22A. In the present embodiment, the gas supply portion 32 includes a gas supply port 33, disposed on the movement surface 22A, which supplies gas to the gap between the guide surface 21G and the movement surface 22A. Meanwhile, the gas supply port 33 may be disposed on the guide surface 21G. Meanwhile, the gas supply port 33 may be disposed on both the guide surface 21G and the movement surface 22A. The liquid LQ of the liquid immersion space LS is prevented from infiltrating into the gap between the guide surface 21G and the movement surface 22A by gas supplied from the gas supply port 33.

Meanwhile, the suppression portion 30 may include the film 31, and may not include the gas supply portion 32. Meanwhile, the suppression portion 30 may include the gas supply portion 32, and may not include the film 31.

Meanwhile, as the suppression portion 30, a convex portion may be provided in at least one of the periphery of the inner edge of the movement surface 22A of the second member 22 defining the opening 26 and the guide surface 21G of the first member 21.

In the present embodiment, a gas bearing is formed between the guide surface 21G and the movement surface 22A. The second member 22 is movably supported by the first member 21 through the gas bearing in a state where the gap is formed between the guide surface 21G and the movement surface 22A.

In the present embodiment, the liquid immersion member 5 includes the gas supply port 33, and a discharge port 34, disposed on the movement surface 22A, which discharges at least a portion of gas in the gap between the guide surface 21G and the movement surface 22A. A gas bearing is formed between the guide surface 21G and the movement surface 22A by the supply of gas from the gas supply port 33 and the discharge of gas from the discharge port 34. Meanwhile, the gas supply port 33 and the discharge port 34 may be disposed on the guide surface 21G.

In the present embodiment, the liquid immersion member 5 includes a hole (opening) 35 that links the space GS between the guide surface 21G and the movement surface 22A to the space (space formed by the chamber device 9) CS around the liquid immersion member 5. In the present embodiment, the opening 35 is formed in the second member 22. The opening 35 is disposed between the inner edge of the movement surface 22A defining the opening 26 and the gas supply port 33 (discharge port 34). The space GS is opened to the space CS (atmosphere) around the liquid immersion member 5 by the opening 35. When the space CS formed by the chamber device 9 is the atmosphere (atmospheric pressure), the atmosphere of the space GS is released by the opening 35. Meanwhile, the space CS formed by the chamber device 9 may not be the atmosphere (atmospheric pressure). Meanwhile, the opening 35 may not be present.

The second member 22 includes an internal surface 22C disposed at the periphery of the external surface 21D of the first member 21. The internal surface 22C links the inner edge of the movement surface 22A to the inner edge of the lower surface 22B. In the present embodiment, the internal surface 22C is inclined downward toward the outside with respect to the radiation direction for the optical axis (light path K) of the terminal optical element 13. Meanwhile, the internal surface 22C may be parallel to the optical axis of the terminal optical element 13 (parallel to the Z-axis).

The supply port 23 is connected to a liquid supply device through a supply channel formed inside the first member 21. The supply port 23 supplies the liquid LQ from the liquid supply device in order to form the liquid immersion space LS. In the present embodiment, the supply port 23 is disposed on the internal surface 21C so as to face a gap between the emission surface 12 and the upper surface 21A. Meanwhile, the supply port 23 may be disposed at the internal surface 21C so as to face a gap between the external surface 16 and the internal surface 21C. The liquid LQ supplied from the supply port 23 is supplied onto the substrate P (object) through the opening 21H.

In the present embodiment, the recovery port 24 of the second member 22 is disposed so as to face the substrate P (object). In the present embodiment, the second member 22 includes a porous member 25. In the present embodiment, the lower surface 22B of the second member 22 includes a lower surface of the porous member 25. The recovery port 24 includes a hole of the porous member 25. The porous member 25 includes, for example, a sintered body or a porous member. The recovery port 24 (hole of the porous member 25) is connected to a liquid recovery device (not shown). The liquid recovery device can connect the recovery port 24 and a vacuum system (not shown). The recovery port 24 can recover at least a portion of the liquid LQ of the liquid immersion space LS. The liquid LQ recovered from the recovery port 24 is recovered by the liquid recovery device. Meanwhile, the internal surface 22C of the second member 22 may be provided with a recovery port capable of recovering the liquid LQ.

In the present embodiment, the operation of recovering the liquid LQ from the recovery port 24 is performed concurrently with the operation of supplying the liquid LQ from the supply port 23, and thus the liquid immersion space LS is formed by the liquid LQ between the terminal optical element 13 and the liquid immersion member 5 on one side and the substrate P (object) on the other side.

In the present embodiment, a portion of an interface LG of the liquid LQ of the liquid immersion space LS is formed between the second member 22 and the substrate P (object). A portion of the lower surface 22B of the second member 22 and the internal surface 22C come into contact with the liquid LQ of the liquid immersion space LS.

In addition, in the present embodiment, a portion of the interface LG of the liquid LQ of the liquid immersion space LS is formed between the inner edge of the guide surface 21G of the first member 21 and the inner edge of the movement surface 22A of the second member 22. The guide surface 21G and the movement surface 22A do not come into contact with the liquid LQ of the liquid immersion space LS.

In addition, in the present embodiment, a portion of the interface LG of the liquid LQ of the liquid immersion space LS is formed between the internal surface 21C of the first member 21 and the external surface 16 of the terminal optical element 13.

Meanwhile, a portion of the interface LG of the liquid LQ of the liquid immersion space LS may be formed between the substrate P (object) and the first member 21 (for example, guide surface 21G).

In the following description, the interface LG of the liquid LQ formed between the second member 22 and the substrate P (object) is appropriately referred to as a first interface LG1, the interface LG of the liquid LQ formed between the first member 21 and the second member 22 is appropriately referred to as a second interface LG2, and the interface LG of the liquid LQ formed between the first member 21 and the terminal optical element 13 is appropriately referred to as a third interface LG3.

Figure 5:
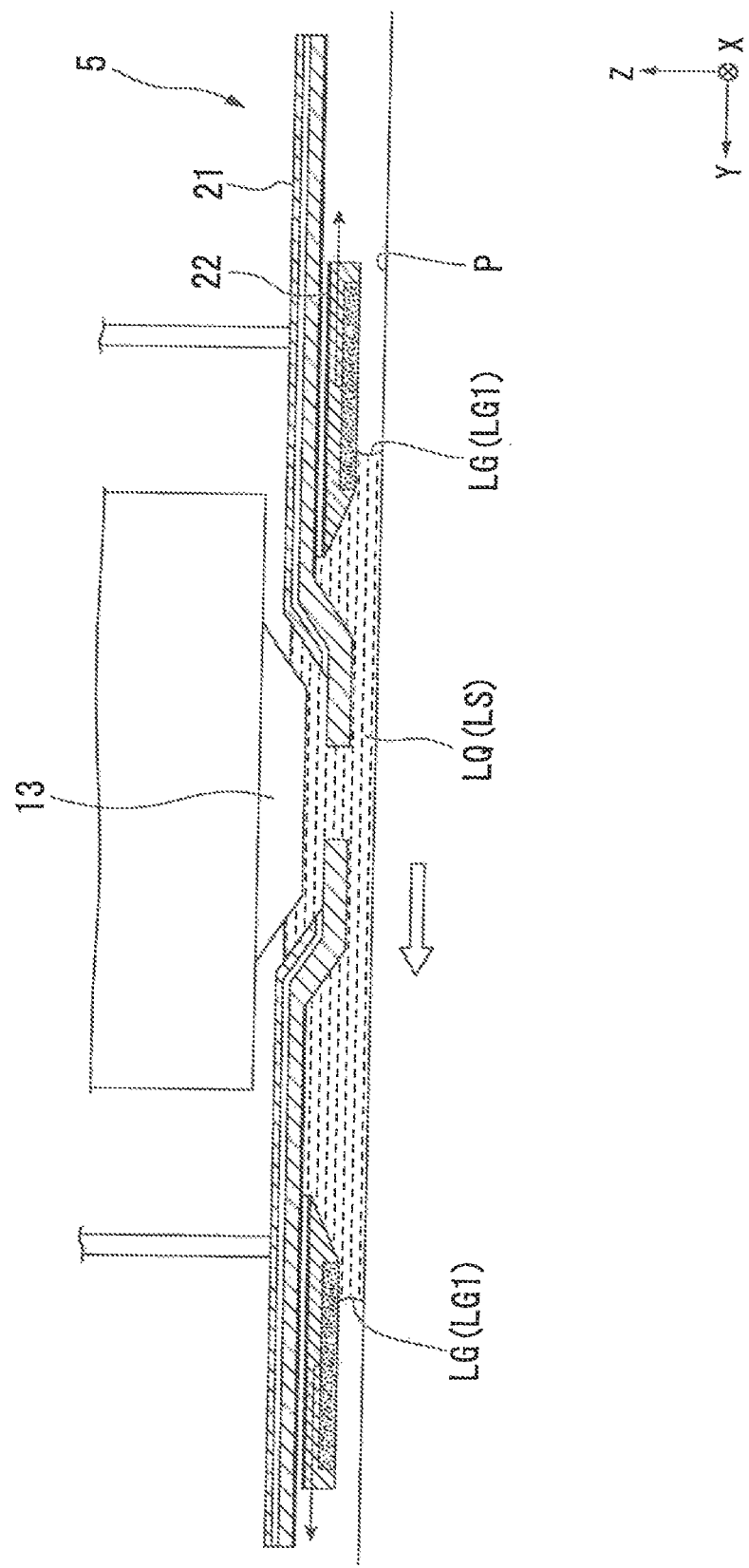
FIG. 5 is a diagram illustrating an example of an operation of the liquid immersion member according to the first embodiment.
Figure 6:
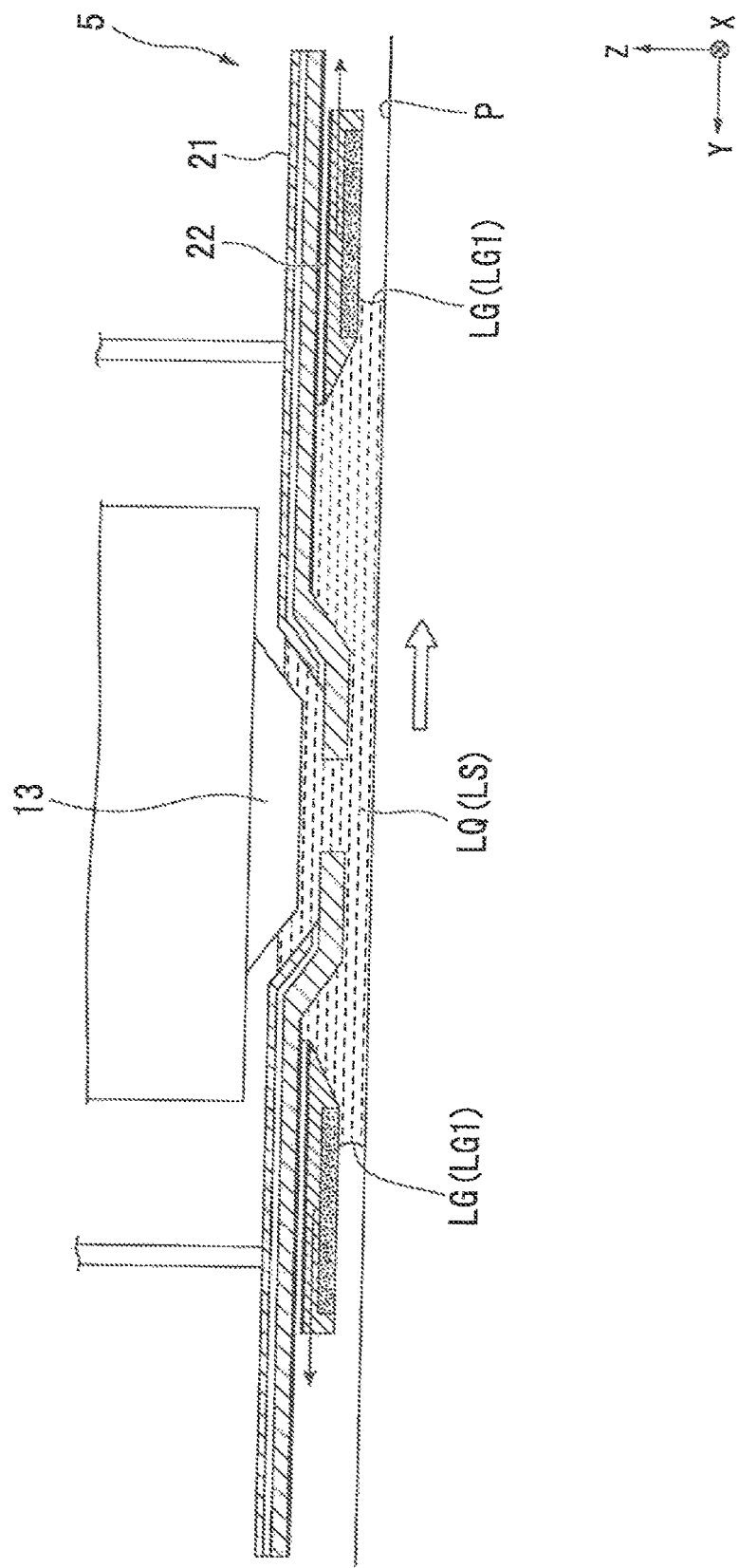
FIG. 6 is a diagram illustrating an example of an operation of the liquid immersion member according to the first embodiment.

FIGS. 5 and 6 are diagrams illustrating an example of an operation of the second member 22. The control device 6 moves the second member 22 concurrently with at least a portion of the movement of the substrate P (object), for example, on the basis of movement conditions of the substrate P (object).

The second member 22 can recover the liquid LQ from the recovery port 24 while moving. The control device 6 moves the second member 22 concurrently with the recovery of the liquid LQ from the recovery port 24. The control device 6 moves the second member 22 while not performing the supply of the liquid LQ from the supply port 23 and the recovery of the liquid LQ from the recovery port 24 so that the liquid immersion space LS continues to be formed.

As mentioned above, the second member 22 can move substantially parallel to the XY plane in a state where the liquid immersion space LS is formed. The second member 22 can move the first member 21 (third portion 213) and the substrate P (object) while forming the liquid immersion space LS. The second member 22 can move in a space around the first member 21 (second portion 212) in a state where the liquid immersion space LS is formed.

In the present embodiment, the second member 22 moves so that the relative movement between the second member and the substrate P (object) decreases. In addition, the second member 22 moves so that the relative movement between the second member and the substrate P (object) decreases more than the relative movement between the first member 21 and the substrate P (object). For example, the second member 22 may move in synchronization with the substrate P (object). For example, the second member 22 may move so as to follow the substrate P (object).

The relative movement includes at least one of a relative velocity and a relative acceleration. For example, the second member 22 may move so that the relative velocity between the second member and the substrate P (object) decreases while forming the liquid immersion space LS. In addition, the second member 22 may move so that the relative acceleration between the second member and the substrate P (object) decreases in a state where the liquid immersion space LS is formed. In addition, the second member 22 may move so that the relative velocity between the second member and the substrate P (object) decreases more than the relative velocity between the first member 21 and the substrate P (object) in a state where the liquid immersion space LS is formed. In addition, the second member 22 may move so that the relative acceleration between the second member and the substrate P (object) decreases more than the relative acceleration between the first member 21 and the substrate P (object) in a state where the liquid immersion space LS is formed.

For example, as shown in FIG. 5, when the substrate P (object) moves in the +Y-axis direction, the control device 6 moves the second member 22 in the +Y-axis direction so that the relative velocity between the second member 22 and the substrate P (object) decreases. Meanwhile, the control device 6 may move in at least one of the +X-axis direction and the −X-axis direction while moving the second member 22 in the +Y-axis direction so that the relative velocity between the second member 22 and the substrate P (object) decreases. That is, when the substrate P (object) moves in the +Y-axis direction, the second member 22 may move in an arbitrary direction within the XY plane including a component of the +Y-axis direction so that the relative velocity between the second member and the substrate P (object) decreases.

In addition, as shown in FIG. 6, when the substrate P (object) moves in the −Y-axis direction, the control device 6 moves the second member 22 in the −Y-axis direction so that the relative velocity between the second member 22 and the substrate P (object) decreases. Meanwhile, the control device 6 may move in at least one of the +X-axis direction and the −X-axis direction while moving the second member 22 in the −Y-axis direction so that the relative velocity between the second member 22 and the substrate P (object) decreases. That is, when the substrate P (object) moves in the −Y-axis direction, the second member 22 may move in an arbitrary direction within the XY plane including a component of the −Y-axis direction so that the relative velocity between the second member and the substrate P (object) decreases.

Meanwhile, when the substrate P (object) moves in the +X-axis direction, the second member 22 may move in an arbitrary direction within the XY plane including a component of the +X-axis direction so that the relative velocity between the second member and the substrate P (object) decreases. In addition, when the substrate P (object) moves in the −X-axis direction, the second member 22 may move in an arbitrary direction within the XY plane including a component of the −X-axis direction so that the relative velocity between the second member and the substrate P (object) decreases.

Next, a method of exposing the substrate P using the exposure apparatus EX having the above-mentioned configuration will be described.

In a substrate replacement position separated from the liquid immersion member 5, a process of loading the substrate P before exposure onto the substrate stage 2 (first holding portion) is performed. In addition, in at least a portion of the period in which the substrate stage 2 is separated from the liquid immersion member 5, the measurement stage 3 is disposed so as to face the terminal optical element 13 and the liquid immersion member 5. The control device 6 performs the supply of the liquid LQ from the supply port 23 and the recovery of the liquid LQ from the recovery port 24, and forms the liquid immersion space LS on the measurement stage 3.

After the substrate P before exposure is loaded onto the substrate stage 2, and the measurement process using the measurement stage 3 is terminated, the control device 6 move the substrate stage 2 so that the terminal optical element 13 and the liquid immersion member 5 and the substrate stage 2 (substrate P) face each other. In a state where the terminal optical element 13 and the liquid immersion member 5 and the substrate stage 2 (substrate P) face each other, the recovery of the liquid LQ from the recovery port 24 is performed concurrently with the supply of the liquid LQ from the supply port 23, and thus the liquid immersion space LS is formed between the terminal optical element 13 and the liquid immersion member 5 and the substrate stage 2 (substrate P) so that the light path K is filled with the liquid LQ.

The control device 6 starts an exposure process of the substrate P. The control device 6 emits the exposure light EL from the illumination system IL in a state where the liquid immersion space LS is formed on the substrate P. The illumination system IL illuminates the mask M with the exposure light EL. The substrate P is irradiated with the exposure light EL from the mask M through the liquid LQ of the liquid immersion space LS between the projection optical system PL and the emission surface 12 and the substrate P. Thereby, the substrate P is exposed with the exposure light EL emitted from the emission surface 12 through the liquid LQ of the liquid immersion space LS, and an image of a pattern of the mask M is projected onto the substrate P.

The exposure apparatus EX of the present embodiment is a scanning-type exposure apparatus (so-called scanning stepper) that projects the image of the pattern of the mask M onto the substrate P while synchronously moving the mask M and the substrate P in a predetermined scanning direction. In the present embodiment, the scanning direction (synchronous movement direction) of the substrate P is set to a Y axial direction, and the scanning direction (synchronous movement direction) of the mask M is also set to a Y axial direction. The control apparatus 6 irradiates the substrate P with the exposure light EL through the projection optical system PL and the liquid LQ of the liquid immersion space LS on the substrate P, while moving the substrate P in the Y axial direction with respect to the projection region PR of the projection optical system PL, and moving the mask M in the Y axial direction with respect to the illumination region IR of the illumination system IL in synchronization with the movement of the substrate P in the Y axial direction.

Figure 7:
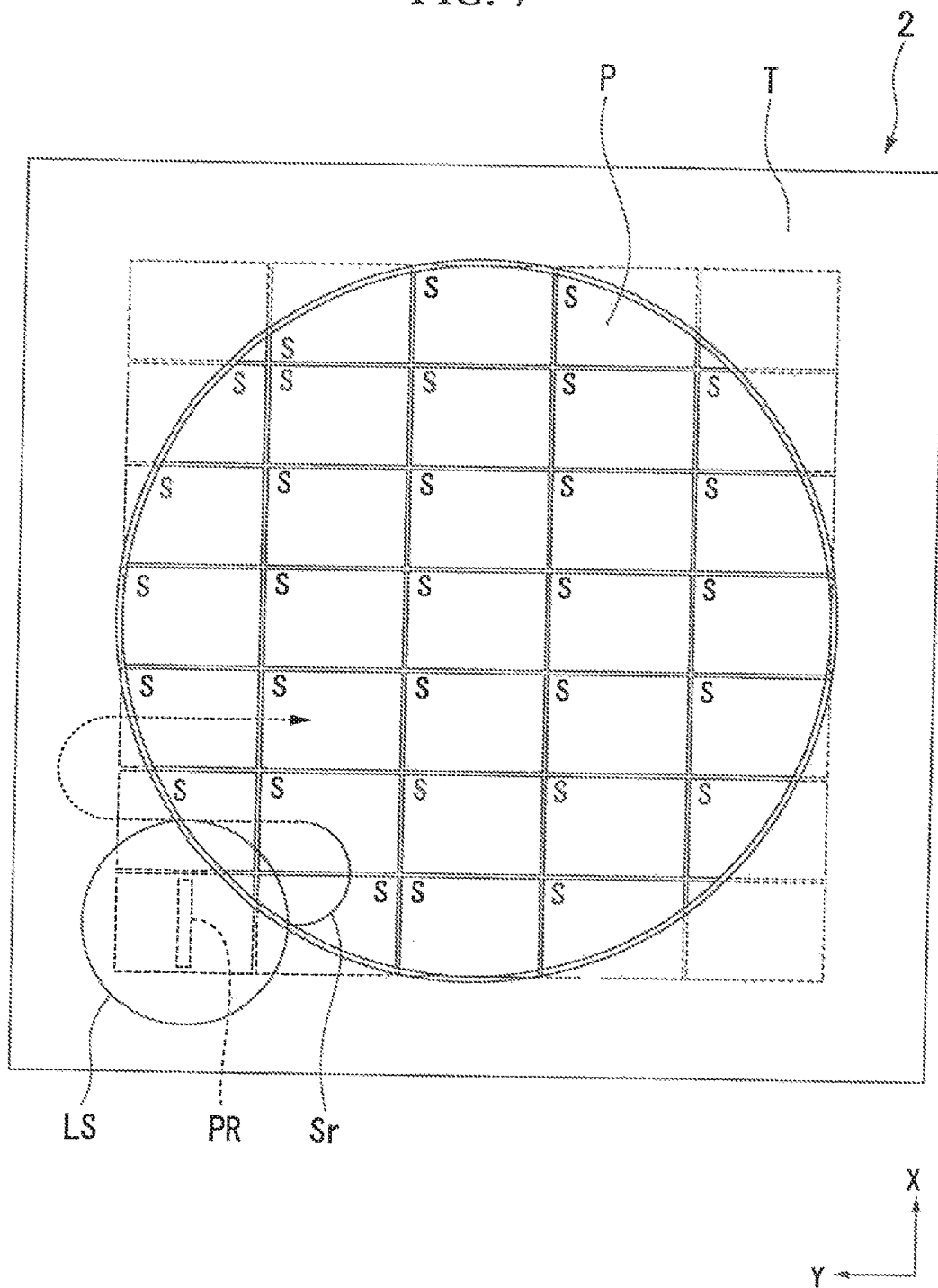
FIG. 7 is a diagram illustrating an example of an operation of the exposure apparatus according to the first embodiment.

FIG. 7 is a diagram illustrating an example of the substrate P held by the substrate stage 2. In the present embodiment, a plurality of shot regions S which are regions to be exposed are disposed at the substrate P in a matrix. The control device 6 sequentially exposes the plurality of shot regions S of the substrate P held by the first holding portion with the exposure light EL through the liquid LQ of the liquid immersion space LS.

For example, in order to expose a first shot region S of the substrate P, the control device 6 moves the substrate P (first shot region S) in the Y-axis direction with respect to the projection region PR of the projection optical system PL in a state where the liquid immersion space LS is formed, and irradiates the first shot region S with the exposure light EL through the projection optical system PL and the liquid LQ of the liquid immersion space LS on the substrate P while moving the mask M in the Y-axis direction with respect to the illumination region IR of the illumination system IL, in synchronization with the movement of the substrate P in the Y-axis direction. Thereby, the image of the pattern of the mask M is projected onto the first shot region S of the substrate P, and the first shot region S is exposed with the exposure light EL emitted from the emission surface 12. After the exposure of the first shot region S is terminated, the control device 6 moves the substrate P in the direction (for example, X-axis direction, direction inclined with respect to the X-axis and the Y-axis directions within the XY plane, or the like) intersecting the X-axis within the XY plane, in order to start to the exposure of the next second shot region S, in a state where the liquid immersion space LS is formed, and moves the second shot region S to an exposure start position. Thereafter, the control device 6 starts the exposure of the second shot region S.

The control device 6 sequentially exposes a plurality of shot regions of the substrate P while repeating an operation of exposing a shot region during the movement of the shot region in the Y-axis direction with respect to a position (projection region PR) irradiated with the exposure light EL from the emission surface 12 in a state where the liquid immersion space LS is formed on the substrate P (substrate stage 2), and operation of moving the substrate P in the direction (for example, X-axis direction, direction inclined with respect to the X-axis and Y-axis directions within the XY plane, or the like) intersecting the Y-axis direction within the XY plane so that the next shot region is disposed at an exposure start position in a state where the liquid immersion space LS is formed on the substrate P (substrate stage 2) after the exposure of the shot region.

In the following description, in a state where the liquid immersion space LS is formed on the substrate P (substrate stage 2) in order to expose the shot region, the operation of moving the substrate P (shot region) in the Y-axis direction with respect to the position (projection region PR) irradiated with the exposure light EL from the emission surface 12 is appropriately referred to as a scanning movement operation. In addition, until the exposure of the next shot region is started in a state where the exposure of a certain shot region is completed and then the liquid immersion space LS is formed on the substrate P (substrate stage 2), the operation of moving the substrate P within the XY plane is appropriately referred to as a step movement operation. The control device 6 sequentially exposes a plurality of shot regions S of the substrate P while repeating the scanning movement operation and the step movement operation. Meanwhile, the scanning movement operation is constant velocity movement wholly with respect to the Y-axis direction. The step movement operation includes acceleration and deceleration movement. For example, the step movement operation between two shot regions adjacent to the X-axis direction includes acceleration and deceleration movement with respect to the Y-axis direction, and acceleration and deceleration movement with respect to the X-axis direction.

Meanwhile, in at least a portion of the scanning movement operation and the step movement operation, at least a portion of the liquid immersion space LS may be formed on the substrate stage 2 (cover member T).

The control device 6 controls the drive system 15 on the basis of the exposure conditions of a plurality of shot regions S on the substrate P, and moves the substrate P (substrate stage 2). The exposure conditions of the plurality of shot regions S are defined by, for example, exposure control information called an exposure recipe. The exposure control information is stored in the storage device 7. The control device 6 sequentially exposes the plurality of shot regions S while moving the substrate P under predetermined movement conditions on the basis of the exposure conditions stored in the storage device 7. The movement conditions of the substrate P (object) include at least one of the movement velocity, the acceleration, the movement distance, the movement direction, and the movement locus within the XY plane.

The control device 6 irradiates the projection region PR with the exposure light EL while moving the substrate stage 2 so that the projection region PR of the projection optical system PL and the substrate P relatively move along the movement locus as, for example, shown by arrow Sr of FIG. 7, and sequentially exposes the plurality of shot regions S of the substrate P with the exposure light EL through the liquid LQ.

Hereinafter, the above-mentioned processes are repeated, and a plurality of substrates P are sequentially exposed.

In the present embodiment, the second member 22 moves in at least a portion of the exposure process of the substrate P. The second member 22 moves so that the relative movement (relative velocity or relative acceleration) between the second member and the substrate P (substrate stage 2) decreases when the scanning movement operation and the step movement operation are performed on the substrate P (substrate stage 2) in a state where the liquid immersion space LS is formed.

FIG. 8(A) is a diagram schematically illustrating an example of the movement locus of the substrate P when a shot region Sa and a shot region Sb are sequentially exposed, and FIG. 8(B) is a diagram schematically illustrating an example of the movement locus of the second member 22 when the shot region Sa and the shot region Sb are sequentially exposed.

As shown in FIG. 8(A), when the shot region Sa is exposed, under the terminal optical element 13, the substrate P sequentially moves on a path Tp1 from a position d1 to a position d2 adjacent to the −Y-axis side with respect to the position d1, a path Tp2 from the position d2 to a position d3 adjacent to the −X-axis side with respect to the position d2, a path Tp3 from a position d3 to a position d4 adjacent to the +Y-axis side with respect to the position d3, and a path Tp4 from a position d4 to a position d5 adjacent to the −X-axis side with respect to the position d4. The positions d1, d2, d3, and d4 are positions within the XY plane.

At least a portion of the path Tp1 is a straight line parallel to the Y-axis. At least a portion of the path Tp3 is a straight line parallel to the Y-axis. The path Tp2 includes a curved line. The path Tp4 includes a curved line. The position d1 includes a starting point of the path Tp1, and the position d2 includes an end point of the path Tp1. The position d2 includes a starting point of the path Tp2, and the position d3 includes of an end point of the path Tp2. The position d3 includes a starting point of the path Tp3, and the position d4 includes an end point of the path Tp3. The position d4 includes a starting point of the path Tp4, and the position d5 includes an end point of the path Tp4. The path Tp1 is a path on which the substrate P moves in the −Y-axis direction. The path Tp3 is a path on which the substrate P moves in the +Y-axis direction. The path Tp2 and the path Tp4 are paths in which the substrate P moves in a direction based on the −X-axis direction.

When the substrate P moves on the path Tp1 in a state where the liquid immersion space LS is formed, the shot region Sa is irradiated with the exposure light EL through the liquid LQ. The operation of the substrate P moving on the path Tp1 includes the scanning movement operation. In addition, when the substrate P moves on the path Tp3 in a state where the liquid immersion space LS is formed, the shot region Sb is irradiated with the exposure light EL through the liquid LQ. The operation of the substrate P moving on the path Tp3 includes the scanning movement operation. In addition, the operation of the substrate P moving on the path Tp2 and the operation of the substrate moving on the path Tp4 include the step movement operation.

When the substrate P sequentially moves on the paths Tp1, Tp2, Tp3, and Tp4, the second member 22 sequentially moves on the paths Tn1, Tn2, Tn3, and Tn4 as shown in FIG. 8(B). The path Tn1 is a path from a position e1 to a position e2. The path Tn2 is a path from the position e2 to a position e3. The path Tn3 is a path from the position e3 to a position e4. The path Tn4 is a path from the position e4 to the position e1. The path Tn1 includes a straight line. The path Tn2 includes a curved line. The path Tn3 includes a straight line. The path Tn4 includes a curved line. The path Tn1 and the path Tn3 intersect each other. The path Tn1 and the path Tn3 are inclined with respect to both the X-axis and the Y-axis. The path Tn1 is a path in which the second member 22 moves in the −Y-axis direction while moving in the +X-axis direction. The path Tn2 is a path in which the second member 22 moves in a direction based on the −X-axis direction. The path Tn3 is a path in which the second member 22 moves in the +Y-axis direction while moving in the +X-axis direction. The path Tn4 is a path in which the second member 22 moves in a direction based on the −X-axis direction.

That is, in the present embodiment, the second member 22 moves within the XY plane so as to draw the Arabic numeral "8".

Figure 9:
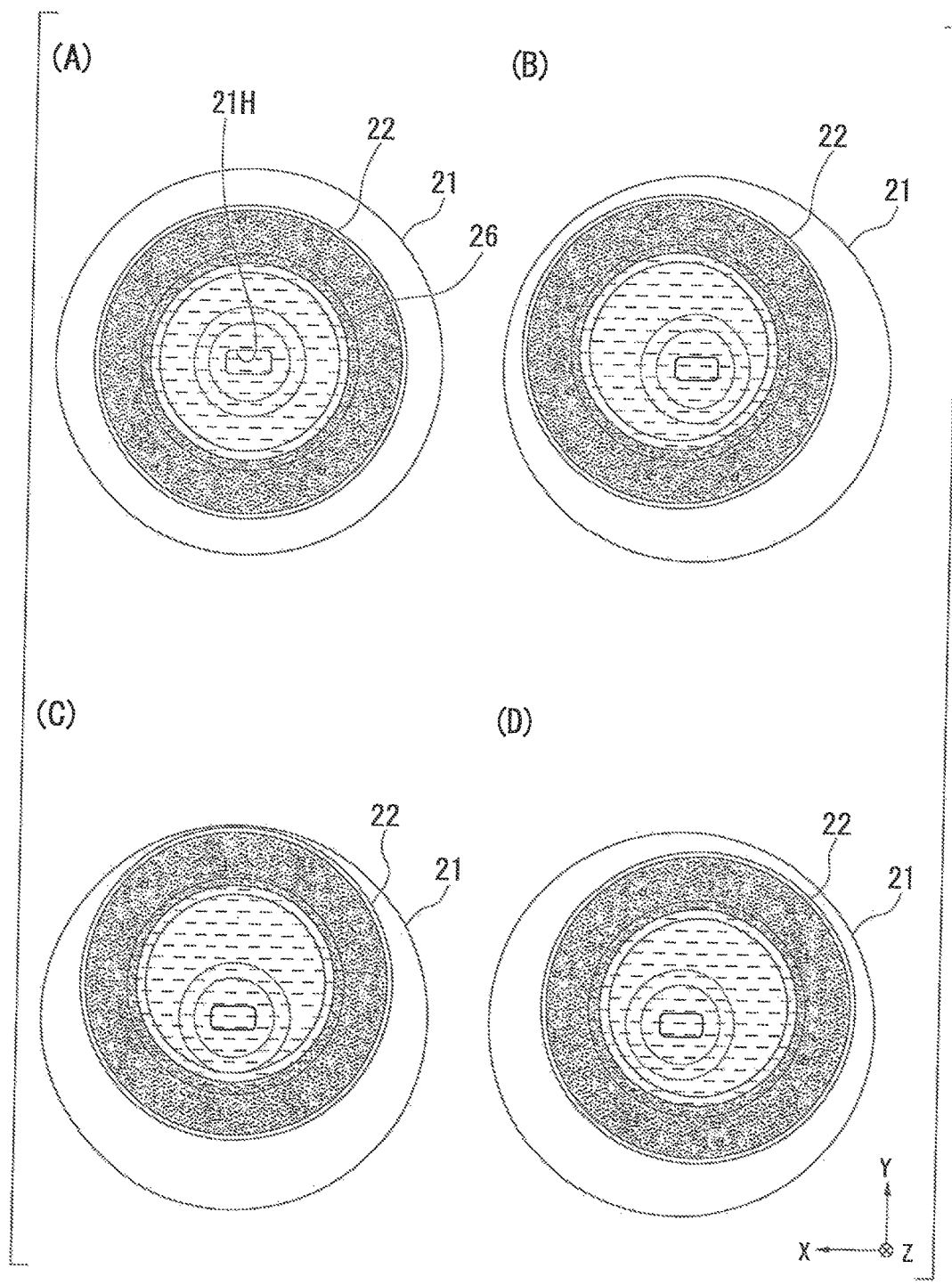
FIG. 9 is a schematic diagram illustrating an example of an operation of the liquid immersion member according to the first embodiment.
Figure 10:
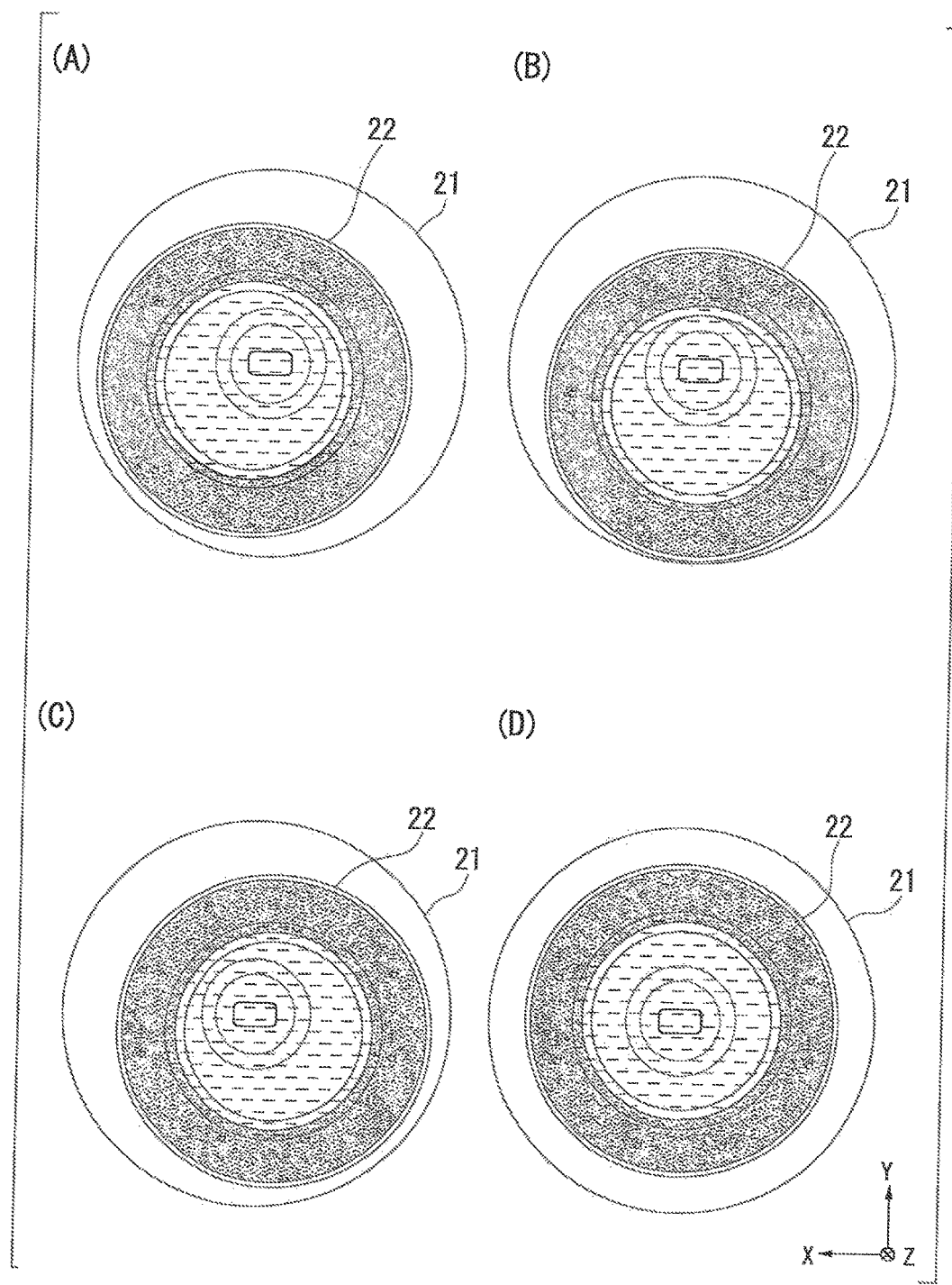
FIG. 10 is a schematic diagram illustrating an example of an operation of the liquid immersion member according to the first embodiment.

FIGS. 9 and 10 are diagrams illustrating an example in a state where the second member 22 moves so as to draw a numeral "8". FIGS. 9 and 10 are diagrams when the second member 22 is viewed upward from the substrate P (object) side. The second member 22 can move so as to change to a state shown in FIG. 10(D) from a state shown in FIG. 9(A) sequentially through states shown in FIG. 9(B), FIG. 9(C), FIG. 9(D), FIG. 10(A), FIG. 10(B), and FIG. 10(C).

Figure 11:
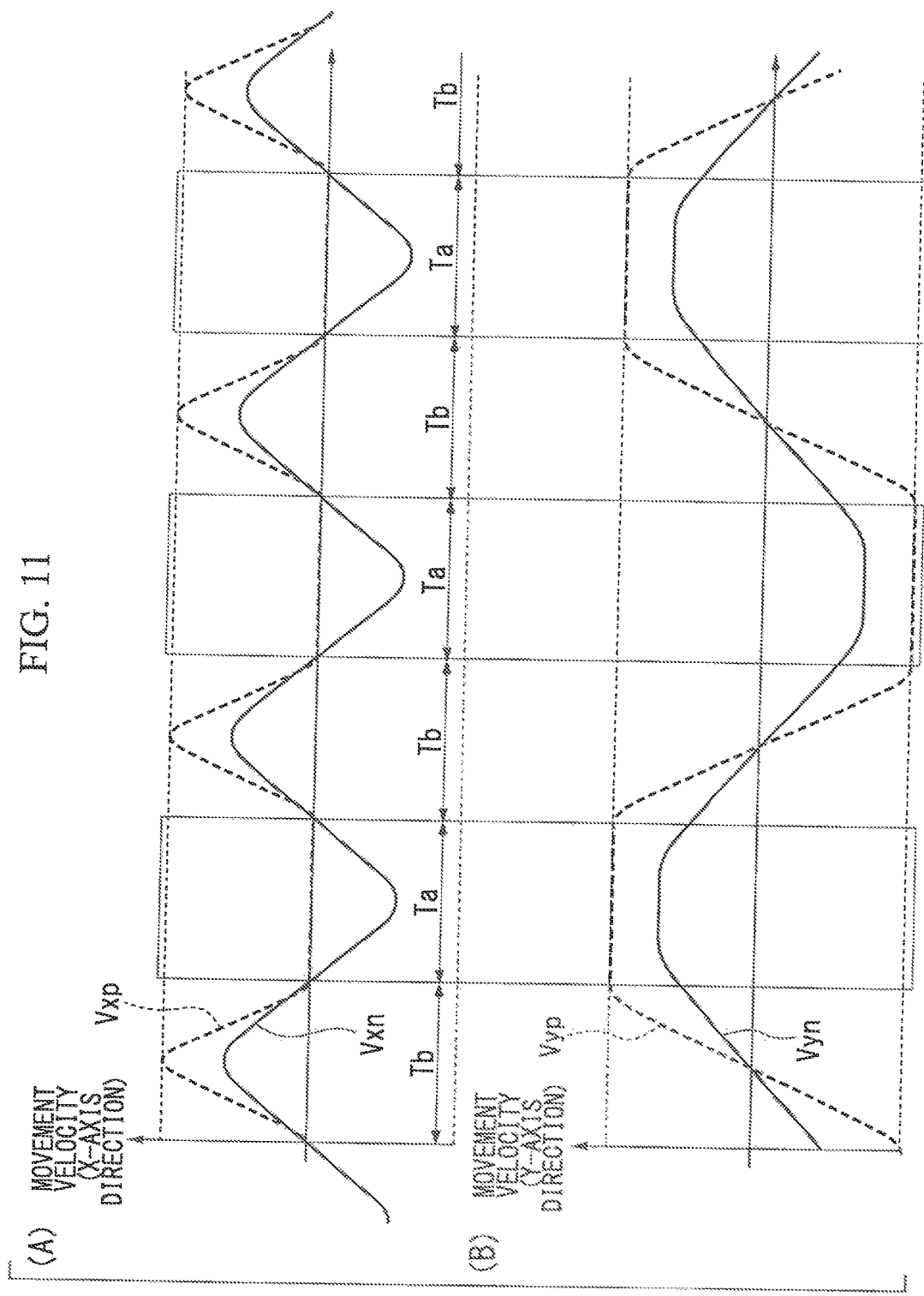
FIG. 11 is a diagram illustrating an example of a velocity profile.
Figure 12:
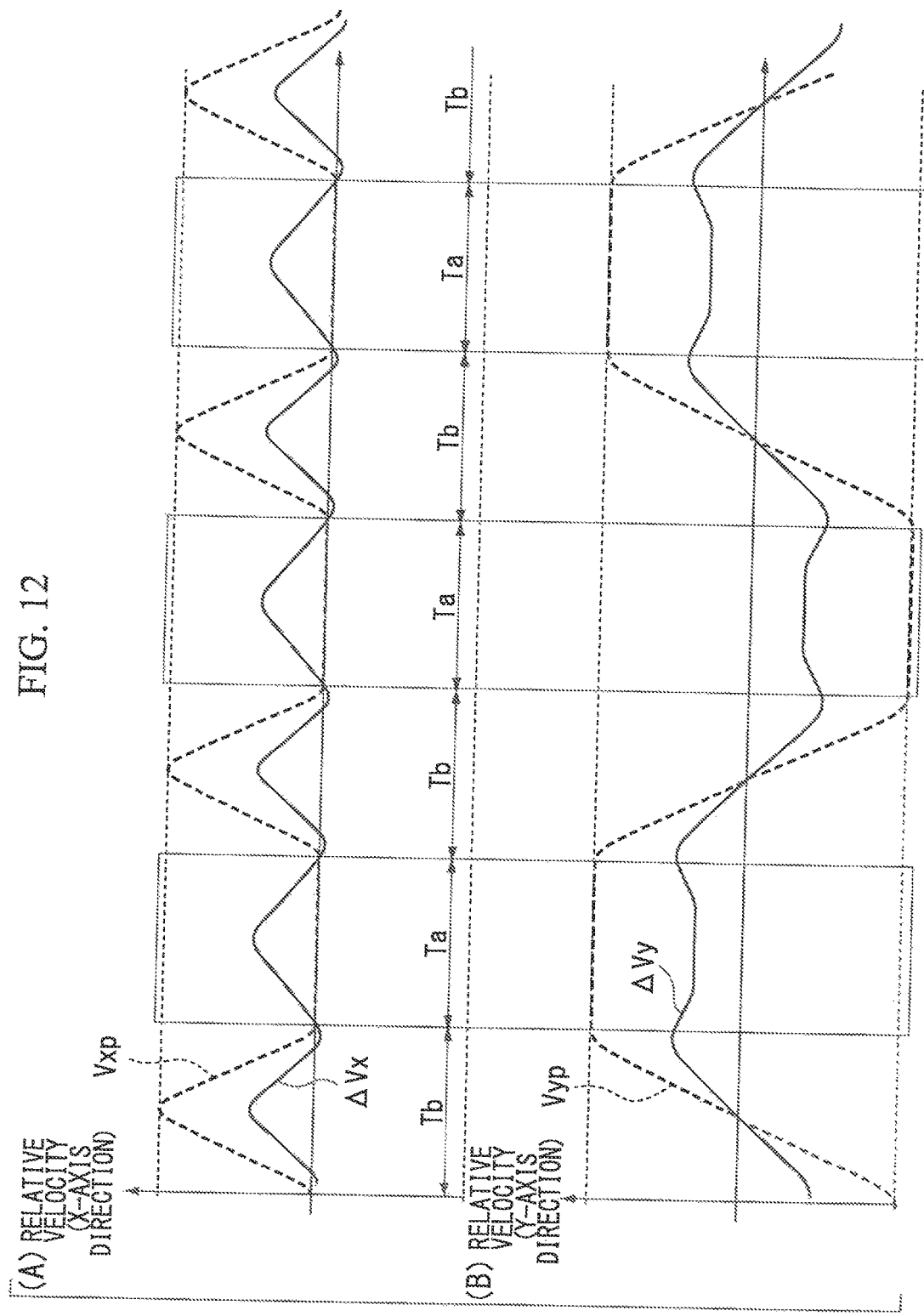
FIG. 12 is a diagram illustrating an example of the velocity profile.

FIGS. 11 and 12 are diagrams illustrating an example of a relationship between the movement velocity of the substrate P (substrate stage 2) when a plurality of adjacent shot regions parallel to the X-axis are sequentially exposed by the scanning movement operation and the step movement operation during step movement in the +X-axis direction and the movement velocity of the second member 22 moving so as to draw the numeral "8" according to the movement of the substrate P.

FIG. 11(A) shows the movement velocities of the substrate P (substrate stage 2) and the second member 22 with respect to the X-axis direction. FIG. 11(B) shows the movement velocities of the substrate P (substrate stage 2) and the second member 22 with respect to the Y-axis direction. Line Vxp of FIG. 11(A) shows the movement velocity of the substrate P (substrate stage 2) with respect to the X-axis direction, and line Vxn shows the movement velocity of the second member 22 with respect to the X-axis direction. In addition, line Vyp of FIG. 11(B) shows the movement velocity of the substrate P (substrate stage 2) with respect to the Y-axis direction, and line Vyn shows the movement velocity of the second member 22 with respect to the Y-axis direction.

In addition, a period Ta of FIG. 11 shows a period in which the scanning movement operation is performed on the substrate P (substrate stage 2). A period Tb shows a period in which the step movement operation is performed on the substrate P (substrate stage 2). As shown in FIG. 11, in at least a portion of the period Ta of the scanning movement operation of the substrate P (substrate stage 2), the second member 22 moves in the same scanning direction (Y-axis direction) as that of the substrate P (substrate stage 2), and moves in the opposite direction (−X-axis direction) to the step direction (+X-axis direction) of the substrate P (substrate stage 2). In addition, in at least a portion of the period Tb of the step movement operation of the substrate P (substrate stage 2), the second member 22 moves in the same scanning direction (Y-axis direction) as that of the substrate P (substrate stage 2), and moves in the same direction (+X-axis direction) as the step direction (+X-axis direction) of the substrate P (substrate stage 2).

FIG. 12(A) shows the relative velocity between the substrate P (substrate stage 2) and the second member 22 with respect to the X-axis direction. FIG. 12(B) shows the relative velocity between the substrate P (substrate stage 2) and the second member 22 with respect to the Y-axis direction. Line ΔVx of FIG. 12(A) shows the relative velocity between the substrate P (substrate stage 2) and the second member 22 with respect to the X-axis direction. Line ΔVy of FIG. 12(B) shows the relative velocity between the substrate P (substrate stage 2) and the second member 22 with respect to the Y-axis direction. Meanwhile, the movement velocity Vxp of the substrate P (substrate stage 2) with respect to the X-axis direction is also shown in FIG. 12(A), and the movement velocity Vyp of the substrate P (substrate stage 2) with respect to the Y-axis direction is also shown in FIG. 12(B).

As shown in FIG. 12, when the scanning movement operation and the step movement operation are performed on the substrate P (substrate stage 2), the second member 22 moves so as to draw the numeral "8", and thus the relative velocity (ΔVx, ΔVy) between the substrate P (substrate stage 2) and the second member 22 can be made to be lower than the movement velocity (Vxp, Vyp) of at least the substrate P (substrate stage 2). In addition, the relative velocity (ΔVx, ΔVy) between the substrate P (substrate stage 2) and the second member 22 can be made to be lower than at least the relative velocity between (Vxp, Vyp) the substrate P (substrate stage 2) and the first member 21.

Meanwhile, in the period Ta of FIG. 11, the velocity (absolute value) when the second member 22 moves at the constant velocity in the scanning direction is lower than the velocity (absolute value) when the substrate P (substrate stage 2) moves at a constant velocity in the scanning direction, but may be the same. In addition, in the period Ta of FIG. 11, a period where the second member 22 moves at the constant velocity in the scanning direction may be absent. Meanwhile, in the period Tb of FIG. 11, the maximum velocity (absolute value) when the second member 22 moves in the step direction is lower than the maximum velocity (absolute value) when the substrate P (substrate stage 2) moves in the step direction, but may be the same. In addition, in the period Tb of FIG. 11, the velocity (absolute value) when the second member 22 moves in the scanning direction is lower than the velocity (absolute value) when the substrate P (substrate stage 2) moves in the scanning direction, but may be the same. In addition, the maximum velocity (absolute value) when the second member 22 moves in the step direction in the period Ta may be the same as the maximum velocity (absolute value) when the second member 22 moves in the step direction in the period Tb, and may be different. For example, the maximum velocity (absolute value) when the second member 22 moves in the step direction in the period Ta may be made to be higher than the maximum velocity (absolute value) when the second member 22 moves in the step direction in the period Tb.

As described above, according to the present embodiment, the second member 22 having the recovery port 24 movable below the first member 21 is provided. Therefore, even when an object such as the substrate P moves within the XY plane in a state where the liquid immersion space LS is formed, for example, the outflow of the liquid LQ from a space between the liquid immersion member 5 and the object or the remaining of the liquid on the object is suppressed. In addition, the generation of bubbles (gas) in the liquid LQ of the liquid immersion space LS is also suppressed.

In addition, the second member 22 is moved so that the relative movement (relative velocity, relative acceleration) between the second member and the object decreases, thereby allowing the outflow of the liquid LQ, the remaining of the liquid LQ, or the generation of bubbles in the liquid LQ to be suppressed even when the object moves at a high speed in a state where the liquid immersion space LS is formed.

Therefore, it is possible to suppress the generation of a defective exposure and the generation of a defective device.

In addition, in the present embodiment, the first member 21 is disposed in at least a portion of the periphery of the terminal optical element 13. Therefore, even when the object moves or the second member 22 moves in a state where the liquid immersion space LS is formed, fluctuation in pressure between the terminal optical element 13 and the first member 21 or great fluctuation in the shape of the third interface LG3 of the liquid LQ between the first member 21 and the terminal optical element 13 is suppressed. Therefore, for example, the generation of bubbles in the liquid LQ or the action of an excessive force on the terminal optical element 13 is suppressed. In addition, in the present embodiment, since the first member 21 does not substantially move, great fluctuation in pressure between the terminal optical element 13 and the first member 21 or great fluctuation in the shape of the third interface LG3 of the liquid LQ between the terminal optical element 13 and the first member 21 is suppressed.

Meanwhile, the first member 21 may be able to move. The first member 21 may move in at least one direction of six directions of the X-axis, Y-axis, Z-axis, θX, θY, and θZ. For example, in order to adjust a positional relationship between the terminal optical element 13 and the first member 21, or adjust a positional relationship between the first member 21 and the second member 22, the first member 21 may be moved. In addition, the first member 21 may be moved concurrently with at least a portion of the movement of the substrate P (object). For example, the first member may be moved a shorter distance than the second member 22 within the XY plane. In addition, the first member 21 may be moved at a lower speed than the second member 22. In addition, the first member 21 may be moved at a lower acceleration that the second member 22.

In addition, in the present embodiment, since the liquid LQ is not present between the guide surface 21G of the first member 21 and the movement surface 22A of the second member 22, the second member 22 can move smoothly.

Meanwhile, the liquid LQ may be present between the guide surface 21G and the movement surface 22A. In addition, the suppression portion 30 may be omitted.

Meanwhile, in the present embodiment, a gas bearing may not be formed between the first member 21 and the second member 22. Meanwhile, in the present embodiment, the first member 21 may not include the third portion 213. In this case, the first member 21 may not be disposed above the second member 22. That is, the second member 22 may not move below the first member 21. Meanwhile, in the present embodiment, the first member 21 and the second member 22 are supported by the device frame 8B, but the first member 21 may be supported by a frame other than the device frame 8B. For example, the first member 21 may be supported by the basic frame 8A.

In addition, in the present embodiment, the internal surface 22C of the second member 22 is inclined downward toward the outside with respect to the radiation direction for the light path K. Therefore, even when the internal surface 22C moves in a state where it comes into contact with the liquid LQ of the liquid immersion space LS, great fluctuations in the pressure inside the liquid immersion space LS and generation of a flow which is not desirable in the liquid LQ of the liquid immersion space LS are suppressed.

Figure 8:
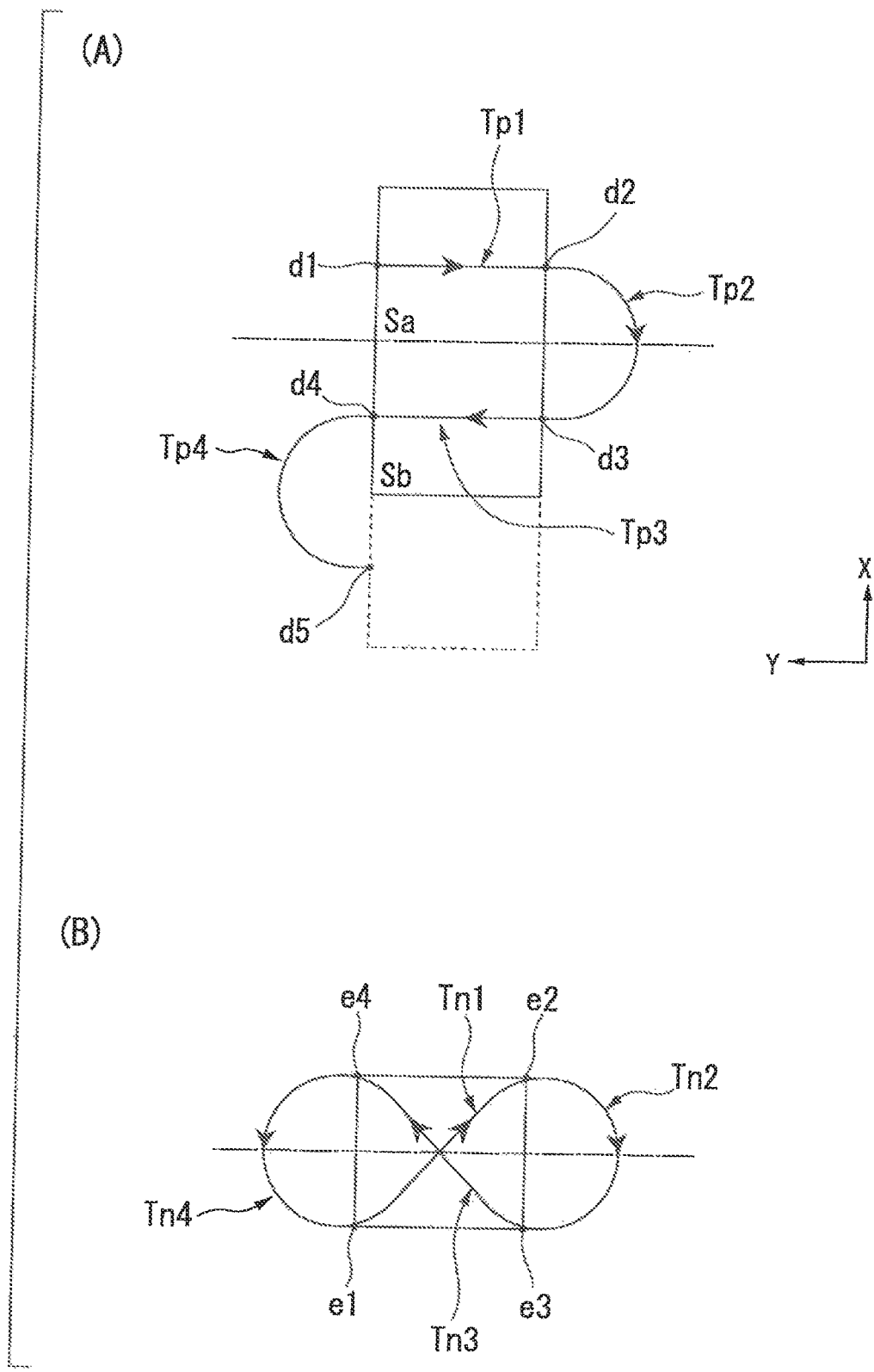
FIG. 8 is a schematic diagram illustrating an example of an operation of the exposure apparatus according to the first embodiment.
Figure 13:
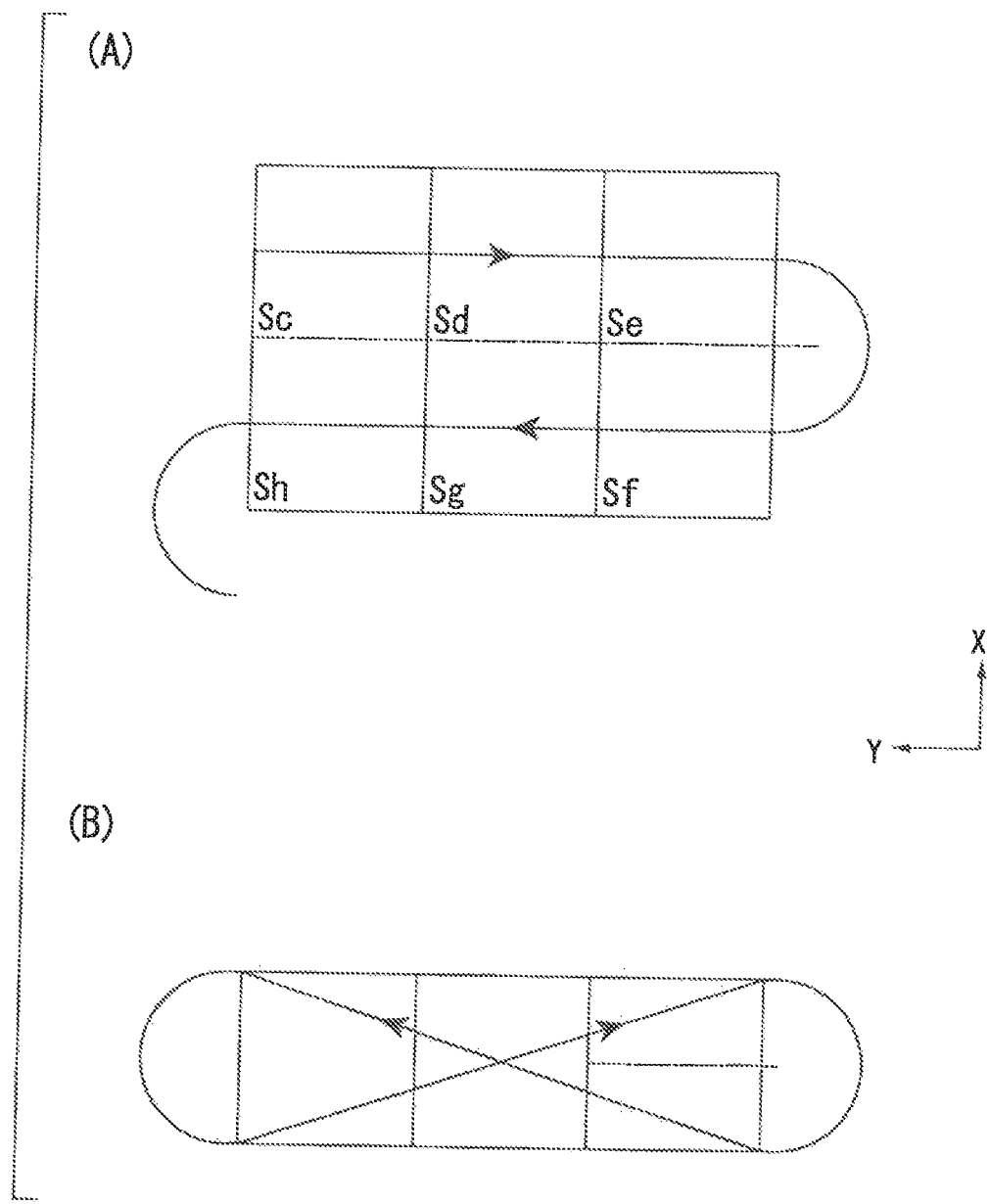
FIG. 13 is a schematic diagram illustrating an example of an operation of the exposure apparatus according to the first embodiment.

Meanwhile, in the example shown in FIG. 8 or the like, when the shot region Sa is exposed and then the shot region Sb disposed at the X-axis direction with respect to the shot region Sa is exposed, the second member 22 is moved. However, for example, as shown in FIG. 13(A), when a shot region Sc, a shot region Sd, and a shot region Se which are disposed at the Y-axis direction are sequentially exposed and then a shot region Sf, a shot region Sg, and a shot region Sh which are disposed at the X-axis direction with respect to the shot regions Se, Sd, and Sc are sequentially exposed, the second member 22 may be moved as shown in FIG. 13(B). In an example shown in FIG. 13, the second member 22 may also be moved so as to draw, for example, the Arabic numeral "8".

Meanwhile, in the above-mentioned embodiment, when the scanning movement operation and the step movement operation are performed on the substrate P, the second member 22 may not draw the Arabic numeral "8". For example, when the second member 22 is set to be moved in only the Y-axis direction, and the scanning movement operation is performed on the substrate P (substrate stage 2), the second member may be just moved in the same Y-axis direction as that of the substrate P.

Meanwhile, in the above-mentioned embodiment, the second member 22 moves so that the guide surface 21G and the movement surface 22A continue to face each other, but the second member 22 may move so that at least a portion of the movement surface 22A protrudes to the outside of the guide surface 21G. Meanwhile, the second member 22 may move so as to come into contact with at least a portion of the first member 21.

Meanwhile, in the above-mentioned embodiment, in a state where the liquid immersion space LS is formed, the second member 22 may move so that the movement distance in the X-axis direction increases more than the movement distance in the Y-axis direction, and may move so that the movement distance in the Y-axis direction increases more than the movement distance in the X-axis direction. In addition, the second member 22 may travel a distance longer or shorter than or equal to the size of the opening 21H with respect to the X-axis direction. In addition, the second member 22 may travel a distance longer or shorter than or equal to the size of the shot region S. In addition, the second member 22 may travel a distance longer or shorter than or equal to the size of the lower surface 21B.

Second Embodiment

A second embodiment will be described. In the following description, the same reference signs and numerals are given to the same components as those of the above-mentioned embodiment, and a description thereof will be simplified or omitted here.

Figure 14:
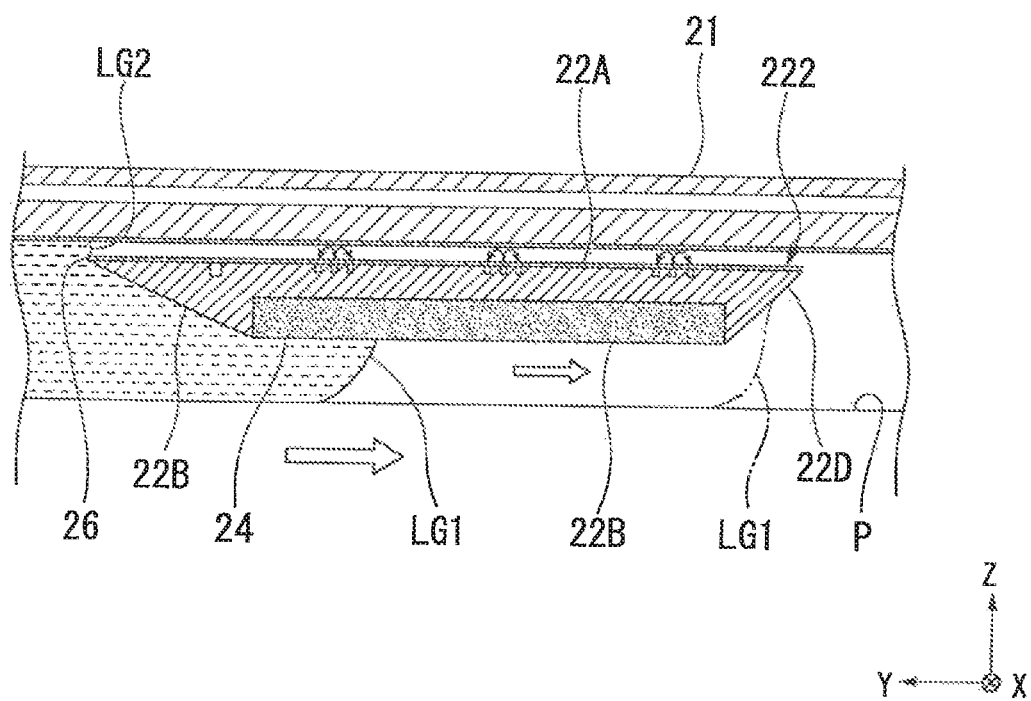
FIG. 14 is a side cross-sectional view illustrating an example of a liquid immersion member according to a second embodiment.

FIG. 14 is a diagram illustrating an example of a second member 222 according to the present embodiment. As shown in FIG. 14, an external surface 22D of the second member 222 may be inclined upward toward the outside with respect to the radiation direction of the light path K. Thereby, for example, even when the first interface LG1 moves to the outside of the lower surface 22B, the outflow of the liquid LQ is suppressed by the inclined external surface 22D. For example, in FIG. 14, when the substrate P (object) moves in the −Y-axis direction, there is a possibility of the first interface LG1 moving in the −Y-axis direction. The inclined external surface 22D is provided, thereby allowing the movement of the first interface LG1 in the −Y-axis direction between the external surface 22D and the upper surface of the substrate P (object) to be suppressed.

In addition, even when the second member 222 moves, the outflow of the liquid LQ is suppressed by the inclined external surface 22D.

Meanwhile, in the present embodiment, a gas bearing may not be provided, and the first member 21 may not include the third portion 213. The same is true of the following embodiment.

Third Embodiment

A third embodiment will be described. In the following description, the same reference signs and numerals are given to the same components as those of the above-mentioned embodiment, and description thereof will be simplified or omitted here.

Figure 15:
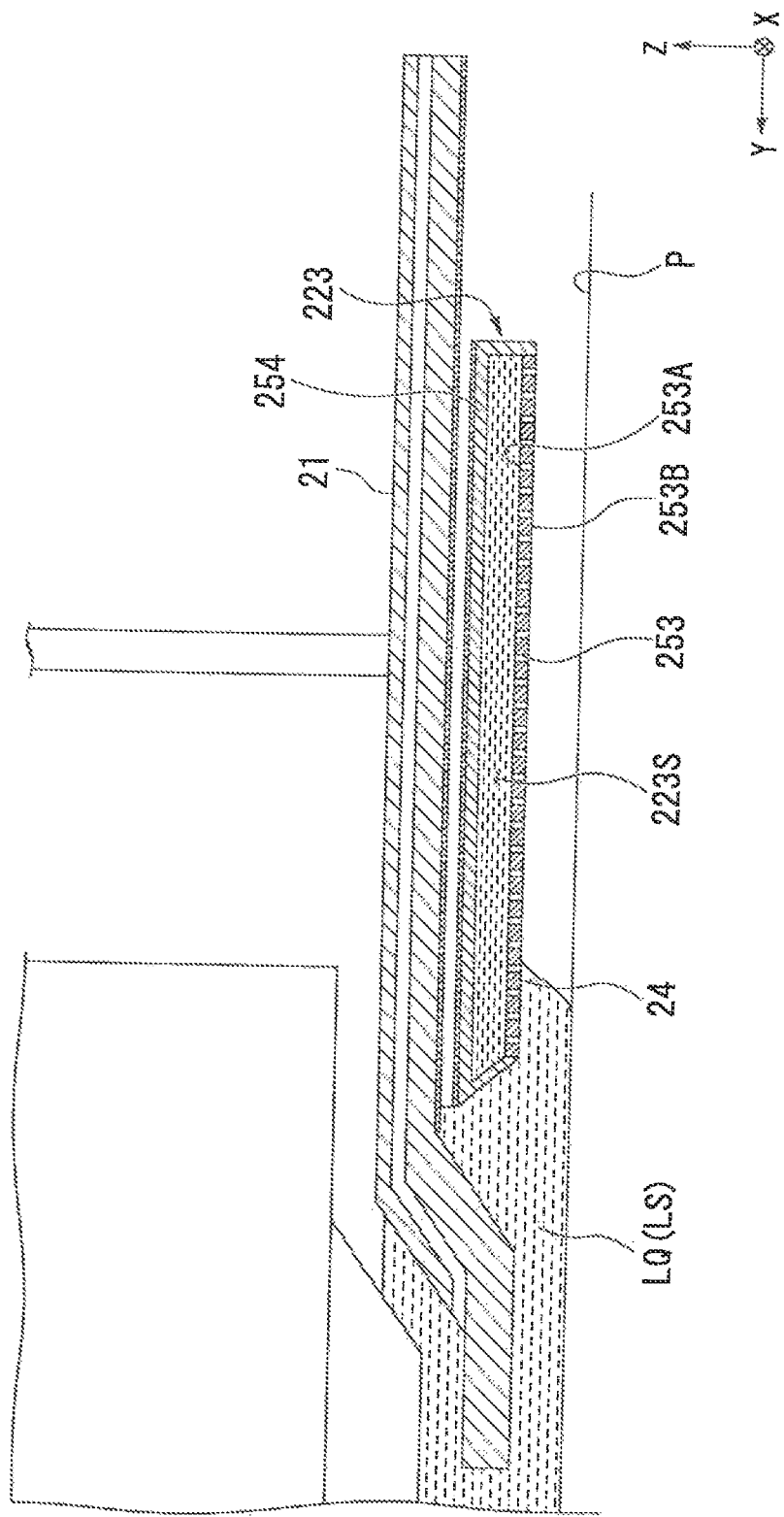
FIG. 15 is a side cross-sectional view illustrating an example of a liquid immersion member according to a third embodiment.

FIG. 15 is a diagram illustrating an example of a second member 223 according to the third embodiment. In the present embodiment, the second member 223 includes a mesh plate 253 and a base member 254 that supports the mesh plate 253. A space 223S is formed between the mesh plate 253 and the base member 254. The mesh plate 253 includes a lower surface 253B capable of facing the substrate P (object), an upper surface 253A facing the space 223S, and a plurality of holes (openings) formed so as to link the upper surface 253A to the lower surface 253B. The recovery port 24 includes a hole (opening) of the mesh plate 253. At least a portion of the liquid LQ that comes into contact with the lower surface 253B can flow into the space 223S through the recovery port 24.

In an example shown in FIG. 15, the space 223S and a liquid recovery device (not shown) are connected to each other. The liquid recovery device includes a vacuum system (not shown). In the present embodiment, only the liquid LQ between the mesh plate 253 and the object is recovered through the recovery port 24, and the difference between pressure on the upper surface 253A side and pressure on the lower surface 253B side is adjusted so that gas is not recovered. Meanwhile, an example of a technique in which only the liquid is substantially recovered through a porous member and the recovery of gas is restricted is disclosed in, for example, Specification of U.S. Pat. No. 7,292,313 and the like.

In the present embodiment, the second member 223 can also recover the liquid LQ while moving. In the present embodiment, the generation of a defective exposure is also suppressed by moving the second member 223.

Fourth Embodiment

A fourth embodiment will be described. In the following description, the same reference signs and numerals are given to the same components as those of the above-mentioned embodiment, and a description thereof will be simplified or omitted here.

Figure 16:
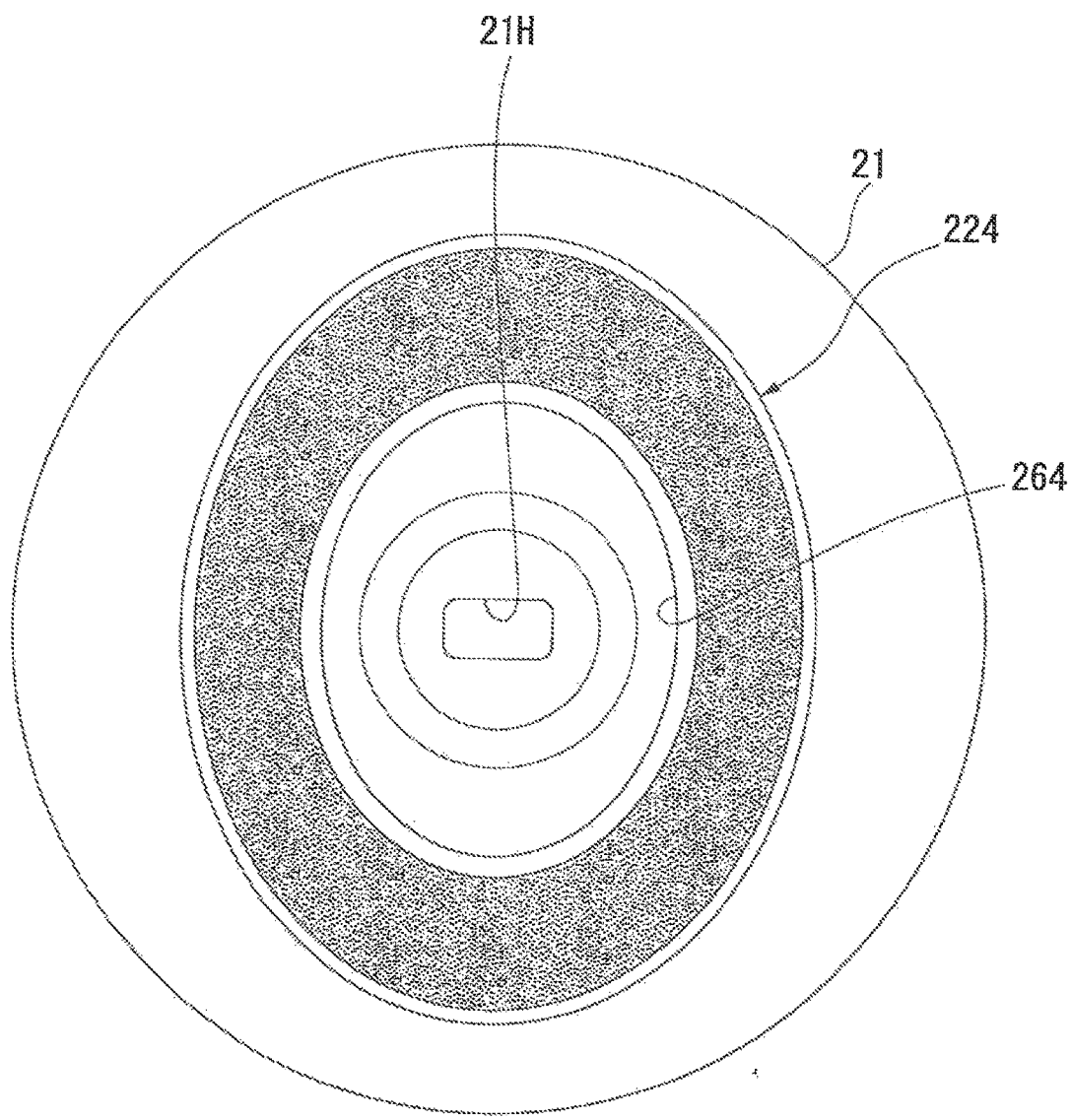
FIG. 16 is a diagram when a liquid immersion member according to a fourth embodiment is viewed from the lower side.

FIG. 16 is a diagram illustrating an example of a second member 224 according to the present embodiment. The second member 224 includes an opening 264 in which at least a portion of the first member 21 is disposed. The sizes of the opening 264 with respect to the X-axis direction and the opening 264 with respect to the Y-axis direction are different from each other. In an example shown in FIG. 16, the size of the opening 264 with respect to the X-axis direction is smaller than the size of the opening 264 with respect to the Y-axis direction. Meanwhile, the size of the opening 264 with respect to the X-axis direction may be larger than the size of the opening 264 with respect to the Y-axis direction. In the example shown in FIG. 16, the shape of the opening 264 of the second member 224 is elliptical.

Meanwhile, in the examples shown in FIG. 3, FIG. 16 and the like, the openings (26 and the like) of the second members (22 and the like) do not include a corner, but may include a corner. For example, the openings (26 and the like) of the second members (22 and the like) may be in the shape of a polygon, such as a triangle, a pentagon, a hexagon, a heptagon, or an octagon.

In addition, in the examples shown in FIG. 3, FIG. 16 and the like, the openings (26 and the like) of the second members (22 and the like) and the outer shape of the second member 22 have similar shapes (resemblance), but may not have the same shape.

Fifth Embodiment

A fifth embodiment will be described. In the following description, the same reference signs and numerals are given to the same components as those of the above-mentioned embodiment, and a description thereof will be simplified or omitted here.

Figure 17:
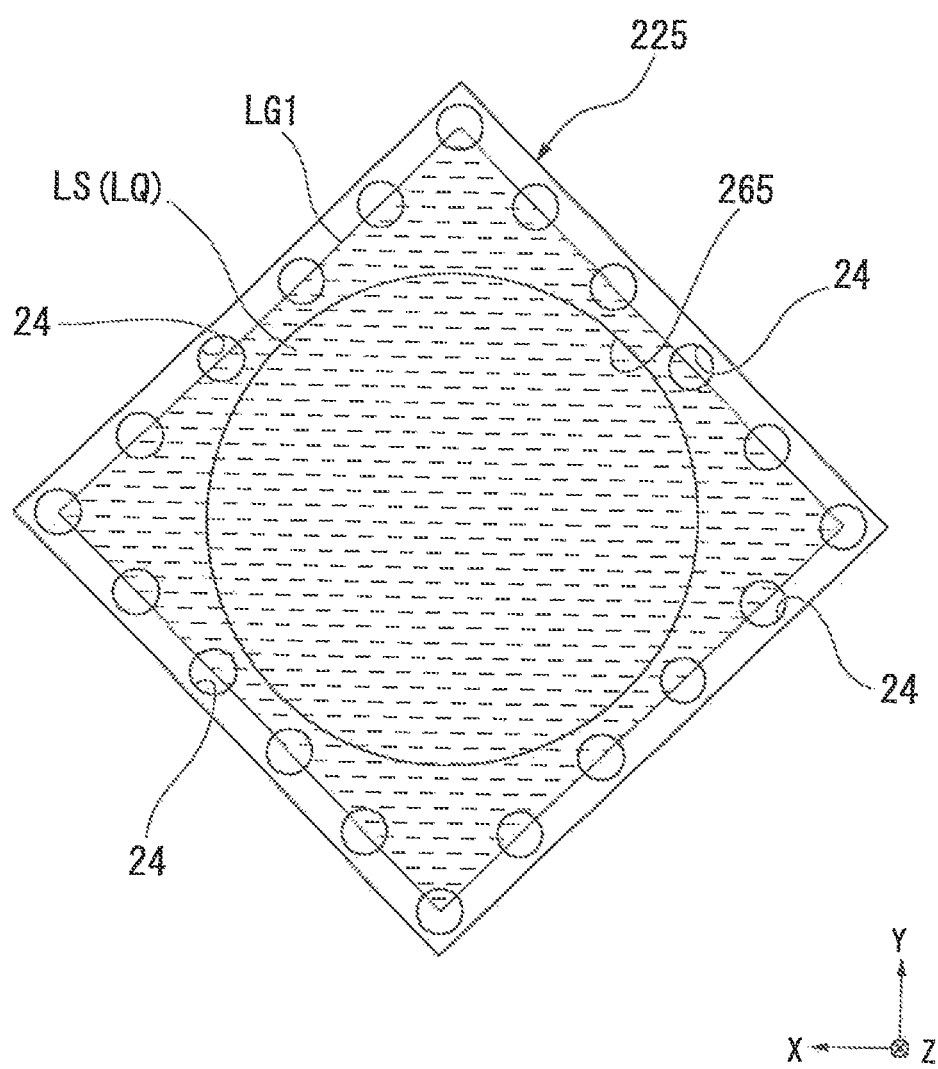
FIG. 17 is a diagram when a liquid immersion member according to a fifth embodiment is viewed from the lower side.

FIG. 17 is a diagram illustrating an example of a second member 225 according to the present embodiment. As shown in FIG. 17, the outer shape of the second member 225 within the XY plane is substantially a quadrigon. An opening 265 of the second member 225 is in the shape of a circle. Meanwhile, the opening 265 may be in the shape of, for example, a polygon such as quadrigon, a hexagon, and an octagon, or may be elliptical.

In the present embodiment, the second member 225 does not include a porous member. In FIG. 17, a plurality of recovery ports 24 are disposed so as to surround the light path K in the lower surface of the second member 225. The recovery ports 24 can recover the liquid LQ and gas all at once. The first interface LG1 of the liquid LQ of the liquid immersion space LS is disposed at the recovery port 24.

In the present embodiment, the generation of a defective exposure is also suppressed by moving the second member 225.

Meanwhile, in the above-mentioned embodiment, the second member (22 and the like) is an annular member surrounding the optical axis of the terminal optical element 13; alternatively, a plurality of second members may be disposed at the periphery of the optical axis. In addition, the plurality of second members may move independently of each other. In addition, among the plurality of second members, some second members may move, and some second members may not move.

Meanwhile, in the above-mentioned embodiment, the control device 6 includes a computer system having a CPU and the like. In addition, the control device 6 includes an interface capable of executing communication with a computer system and an external apparatus. The storage device 7 includes, for example, a memory such as a RAM, a hard disk, and a recording medium such as CD-ROM. An operating system (OS) that controls a computer system is installed on the storage device 7, and a program for controlling the exposure apparatus EX is stored therein.

Meanwhile, an input device capable of inputting an input signal may be connected to the control device 6. The input device includes input devices such as a keyboard and a mouse, communication devices capable of inputting data from an external apparatus, and the like. In addition, a display device such as a liquid crystal display may be provided.

Various types of information including a program recorded in the storage device 7 can be read by the control device (computer system) 6. A program causing the control device 6 to execute the control of the liquid immersion exposure apparatus that exposes a substrate with exposure light through first liquid filled in a light path of exposure light between the substrate and an emission surface of an optical member from which the exposure light is emitted is recorded in the storage device 7.

According to the above-mentioned embodiment, the program recorded in the storage device 7 may cause the control device 6 to execute forming a liquid immersion space so that a light path of exposure light emitted from an emission surface of an optical member is filled with liquid, exposing a substrate with the exposure light emitted from the emission surface through the liquid in the liquid immersion space, and moving a second member, disposed below a first member to maintain a gap with respect to the first member disposed in at least a portion of the periphery of an optical member, which includes a recovery port that recovers at least a portion of the liquid in the liquid immersion space.

The program stored in the storage device 7 is read by the control device 6, and thus various types of apparatuses of the exposure apparatus EX such as the substrate stage 2, the measurement stage 3, and the liquid immersion member 5 execute various types of processes such as a liquid immersion exposure of the substrate P in cooperation with each other in a state where the liquid immersion space LS is formed.

Meanwhile, in each of the above-mentioned embodiments, although the light path K on the emission surface 12 side (image plane side) of the terminal optical element 13 of the projection optical system PL is filled with the liquid LQ, the projection optical system PL may be a projection optical system in which the light path on the incident side (object plane side) of the terminal optical element 13 is also filled with the liquid LQ, for example, as disclosed in Pamphlet of International Publication No. 2004/019128.

Meanwhile, in each of the above-mentioned embodiments, although water is used as the liquid LQ, a liquid other than water may be used. It is preferable that the liquid LQ be able to transmit the exposure light EL, have a high refractive index with respect to the exposure light EL, and be stable with respect to a film such as a photosensitive material (photoresist) from which the projection optical system PL or the surface of the substrate P is formed. For example, the liquid LQ may be a fluorine-based liquid such as hydrofluoroether (HFE), perfluorinated polyether (PFPE), or Fomblin oil. In addition, the liquid LQ may be various fluids, such as, for example, a supercritical fluid.

Meanwhile, in each of the above-mentioned embodiments, the substrate P includes a semiconductor wafer for fabricating a semiconductor device, but may include, for example, a glass substrate for a display device, a ceramic wafer for a thin-film magnetic head, an original plate (synthetic silica, silicon wafer) of a mask or a reticle used in an exposure apparatus, or the like.

Meanwhile, in each of the above-mentioned embodiments, the exposure apparatus EX is a step-and-scan type scanning exposure apparatus (scanning stepper) that scans and exposes the pattern of the mask M by synchronously moving the mask M and the substrate P, but may be, for example, a step-and-repeat type projection exposure apparatus (stepper) in which sequential step movement is performed on the substrate P by collectively exposing the pattern of the mask M in a state where the mask M and the substrate P are stopped.

In addition, in the step-and-repeat type exposure, the exposure apparatus EX may be an exposure apparatus (stitch-type collective exposure apparatus) in which a reduced image of the first pattern is transferred onto the substrate P using the projection optical system in a state where the first pattern and the substrate P are substantially stopped, and then the reduced image of the second pattern is partially overlapped with the first pattern using the projection optical system and is collectively exposed on the substrate P in a state where the second pattern and the substrate P are substantially stopped. In addition, the stitch-type exposure apparatus may be a step-and-stitch type exposure apparatus in which at least two patterns are partially overlapped with each other on the substrate P and are transferred, and the substrate P is sequentially moved.

In addition, for example, as disclosed in Specification of U.S. Pat. No. 6,611,316, the exposure apparatus EX may be an exposure apparatus in which the patterns of two masks are synthesized on the substrate through the projection optical system, and one shot region on the substrate is double-exposed almost simultaneously by one-time scanning exposure. In addition, the exposure apparatus EX may be a proximity-type exposure apparatus, a mirror projection aligner, or the like.

Figure 18:
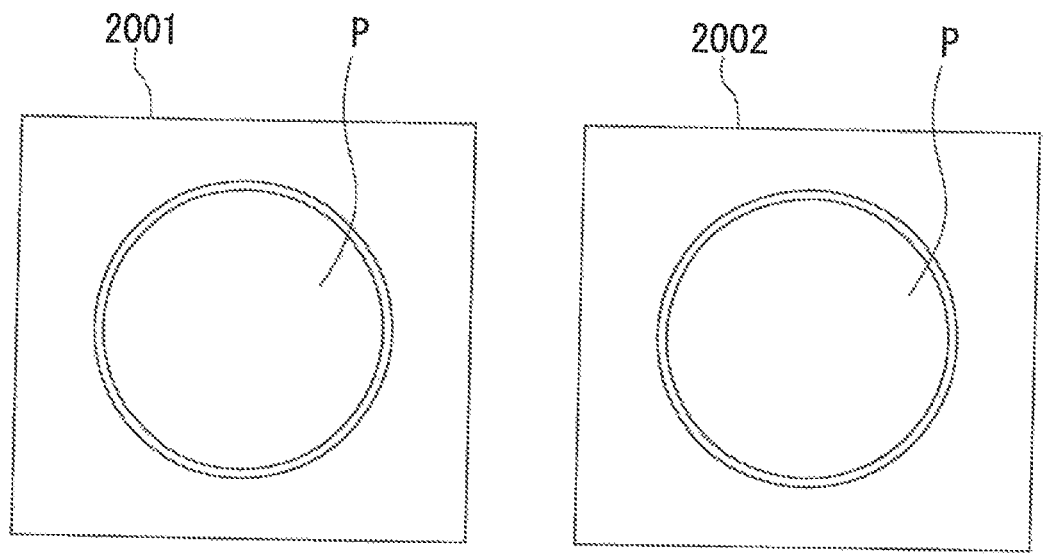
FIG. 18 is a diagram illustrating an example of a substrate stage.

In addition, in each of the above-mentioned embodiments, the exposure apparatus EX may be a twin stage type exposure apparatus including a plurality of substrate stages as disclosed in the specification of U.S. Pat. No. 6,341,007, the specification of U.S. Pat. No. 6,208,407, the specification of U.S. Pat. No. 6,262,796, and the like. For example, as shown in FIG. 18, when the exposure apparatus EX includes two substrate stages 2001 and 2002, the object capable of being disposed so as to face the emission surface 12 includes at least one of a first substrate stage, a substrate held by a first holding portion of the first substrate stage, a second substrate stage, and a substrate held by the first holding portion of the second substrate stage.

In addition, the exposure apparatus EX may be an exposure apparatus including a plurality of substrate stages and measurement stages.

The exposure apparatus EX may be an exposure apparatus for fabricating a semiconductor device that exposes a pattern of a semiconductor device on the substrate P, may be an exposure apparatus for fabricating a liquid crystal device or fabricating a display, and may be an exposure apparatus for fabricating a thin-film magnetic head, an image capturing device (CCD), a micro-machine, a MEMS, a DNA chip, a reticle, a mask, or the like.

Meanwhile, in the above-mentioned embodiments, an optically transmissive mask wherein a prescribed shielding pattern (or phase pattern or dimming pattern) is formed on an optically transmissive substrate, is used; however, instead of such a mask, a variable shaped mask (also called an electronic mask, an active mask, or an image generator), in which a transmissive pattern, a reflective pattern, or a light emitting pattern based on electronic data of the pattern to be exposed is formed, as disclosed in, for example, the specification of U.S. Pat. No. 6,778,257, may be used. In addition, instead of a variable shaped mask that includes a non-emissive type image display device, a pattern forming apparatus that includes a self-luminous type image display device may be provided.

In each of the above-mentioned embodiments, the exposure apparatus EX includes the projection optical system PL, but the components described in each of the above-mentioned embodiments may be applied to an exposure apparatus and an exposure method in which the projection optical system PL is not used. For example, the components described in each of the above-mentioned embodiments may be applied to an exposure apparatus and an exposure method in which a liquid immersion space is form between an optical member such as a lens and a substrate, and the substrate is irradiated with exposure light through the optical member.

In addition, the exposure apparatus EX may be an exposure apparatus (lithographic system) that exposes a line-and-space pattern on the substrate P by forming interference fringes on the substrate P as, for example, disclosed in Pamphlet of International Publication No. 2001/035168.

The exposure apparatus EX according to the above-mentioned embodiments is manufactured by assembling various subsystems, including each of the components mentioned above, so that predetermined mechanical, electrical, and optical accuracies are maintained. To ensure these various accuracies, adjustments are performed before and after this assembly, including an adjustment to achieve optical accuracy for the various optical systems, an adjustment to achieve the mechanical accuracy for the various mechanical systems, and an adjustment to achieve the electrical accuracy for the various electrical systems. The process of assembling the exposure apparatus from the various subsystems includes, for example, the connection of mechanical components, the wiring and connection of electrical circuits, and the piping and connection of the pneumatic circuits among the various subsystems. Naturally, prior to performing the process of assembling the exposure apparatus from these various subsystems, there are also processes of assembling each individual subsystem. When the process of assembling the exposure apparatus from the various subsystems is complete, a comprehensive adjustment is performed to ensure the various accuracies of the exposure apparatus as a whole. Meanwhile, it is preferable to manufacture the exposure apparatus in a clean room in which, for example, the temperature and the cleanliness level are controlled.

Figure 19:
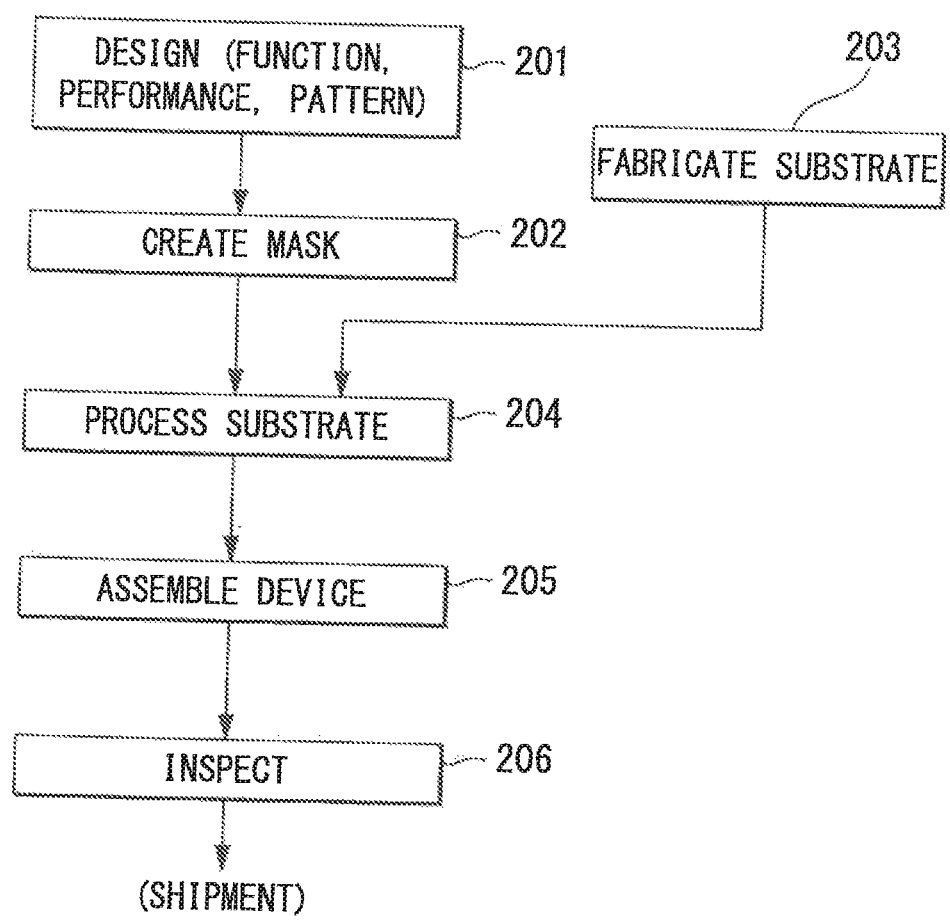
FIG. 19 is a flow diagram illustrating an example of a device fabricating method.

As shown in FIG. 19, a micro-device, such as a semiconductor device, is manufactured by a step 201 of designing the functions and performance of the micro-device, a step 202 of manufacturing the mask (reticle) based on this designing step, a step 203 of manufacturing the substrate P, which is the base material of the device, a substrate processing step 204 of a substrate process (exposure process) that includes, in accordance with the embodiments mentioned above, exposing the substrate P with the exposure light EL that is emitted from the pattern of the mask M and developing the exposed substrate P, a device assembling step 205 (which includes fabrication processes such as dicing, bonding, and packaging processes), an inspecting step 206, and the like.

Meanwhile, the features of each of the embodiments mentioned above can be combined as appropriate. In addition, there may be cases in which some of the components are not used. In addition, each disclosure of every Japanese published patent application and U.S. patent related to the exposure apparatus recited in each of the embodiments, modified examples, and the like discussed above is hereby incorporated by reference in its entirety to the extent permitted by national laws and regulations.

What is claimed is:

1. A liquid immersion exposure apparatus comprising:
   a projection system having a last optical member via which exposure light is projected; and
   a liquid immersion member which forms a liquid immersion space under an emitting surface of the last optical member,
   wherein:
   the liquid immersion member includes (i) a first member which is disposed in at least a portion of a periphery of the last optical member, the first member having a first surface, and (ii) a second member which is movable relative to the first member and which includes a liquid recovery port that recovers at least a portion of a liquid in the liquid immersion space,
   the second member is moved in a direction perpendicular to an optical axis of the last optical member so that a relative speed between the second member and an object below the liquid immersion member is smaller than a relative speed between the first member and the object, while recovering the liquid in a gap between the second member and the object via the liquid recovery port of the second member, and
   the second member has an outer surface that faces radially outward relative to the optical axis of the last optical member, the outer surface does not face toward any surface of the first member.

2. The exposure apparatus according to claim 1, wherein the exposure light is projected to a substrate through the liquid in the liquid immersion space to expose the substrate while the substrate is moved in a scanning direction, the first member includes an opening through which the exposure light is projected and a liquid supply port that supplies the liquid for forming the liquid immersion space, and the liquid recovery port of the second member faces downwardly.

3. The exposure apparatus according to claim 1, wherein the second member is moved concurrently with at least a portion of a movement of the object in a state where the liquid is present in at least a portion of the gap between the second member and the object.

4. The exposure apparatus according to claim 2, wherein the object includes the substrate and the second member is moved so that the relative speed between the second member and the substrate is smaller than the relative speed between the first member and the substrate.

5. The exposure apparatus according to claim 2, wherein the second member is moved concurrently with at least a portion of the exposure of the substrate in which the exposure light is projected to the substrate.

6. The exposure apparatus according to claim 2, wherein the second member is moved concurrently with at least a portion of a step movement of the substrate between a completion of exposure of a shot area of the substrate and a start of exposure of a next shot area of the substrate, each of the shot areas being exposed with the exposure light.

7. The exposure apparatus according to claim 1, wherein the first member is stationary relative to the last optical member.

8. The exposure apparatus according to claim 1, wherein the first member is disposed with a second gap between the first member and the last optical member.

9. The exposure apparatus according to claim 1, further comprising a supply port that supplies the liquid for forming the liquid immersion space.

10. The exposure apparatus according to claim 9, wherein the supply port is disposed at the first member.

11. The exposure apparatus according to claim 10, wherein the supply port supplies the liquid to a second gap between the first member and the last optical member.

12. The exposure apparatus according to claim 2, wherein the liquid immersion space is formed so as to cover a portion of an upper surface of the substrate by recovering the liquid via the liquid recovery port of the second member during the exposure.

13. A device manufacturing method comprising:
exposing a substrate using the exposure apparatus defined in claim 1, and
developing the exposed substrate.

14. A liquid immersion exposure apparatus comprising:
a projection system having a last optical member via which exposure light is projected; and
a liquid immersion member which forms a liquid immersion space under an emitting surface of the last optical member, wherein:
the liquid immersion member includes (i) a first member which is disposed in at least a portion of a periphery of the last optical member, the first member having a first surface, and (ii) a second member which is movable relative to the first member and which includes a liquid recovery port that recovers at least a portion of a liquid in the liquid immersion space, the second member is moved in a direction perpendicular to an optical axis of the last optical member so that a relative speed between the second member and an object below the liquid immersion member is smaller than a relative speed between the first member and the object, while recovering the liquid in a gap between the second member and the object via the liquid recovery port of the second member, the second member has an outer surface that faces radially outward relative to the optical axis of the last optical member, and the first member is not present in an area that extends radially outward from the outer surface of the second member.

15. The exposure apparatus according to claim 14, wherein
the exposure light is projected to a substrate through the liquid in the liquid immersion space to expose the substrate while the substrate is moved in a scanning direction, the first member includes an opening through which the exposure light is projected and a liquid supply port that supplies the liquid for forming the liquid immersion space, and the liquid recovery port of the second member faces downwardly.

16. The exposure apparatus according to claim 14, wherein the second member has a second surface which faces the first surface of the first member.

17. The exposure apparatus according to claim 14, wherein
in the direction perpendicular to the optical axis of the last optical member, no gap is formed between the outer surface of the second member and the first member.

18. A device manufacturing method comprising:
exposing a substrate using the exposure apparatus defined in claim 14, and
developing the exposed substrate.

19. The exposure apparatus according to claim 1, wherein the second member has a second surface which faces the first surface of the first member.

20. The exposure apparatus according to claim 1, wherein in the direction perpendicular to the optical axis of the last optical member, no gap is formed between the outer surface of the second member and the first member.

* * * * *